United States Patent
Kim et al.

(10) Patent No.: US 9,904,491 B2
(45) Date of Patent: Feb. 27, 2018

(54) MEMORY DEVICE, MEMORY SYSTEM, AND METHOD OF OPERATING THE DEVICE

(71) Applicant: SAMSUNG ELECTRONICS CO., LTD., Suwon-si, Gyeonggi-Do (KR)

(72) Inventors: Dong-Uk Kim, Seoul (KR); Jin-Ho Yi, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 50 days.

(21) Appl. No.: 14/956,457

(22) Filed: Dec. 2, 2015

(65) Prior Publication Data

US 2016/0196180 A1 Jul. 7, 2016

(30) Foreign Application Priority Data

Jan. 5, 2015 (KR) .................. 10-2015-0000858

(51) Int. Cl.
| | | |
|---|---|---|
| G11C 29/00 | (2006.01) | |
| G06F 3/06 | (2006.01) | |
| G06F 11/10 | (2006.01) | |
| G11C 29/04 | (2006.01) | |

(52) U.S. Cl.
CPC ............ *G06F 3/0679* (2013.01); *G06F 3/064* (2013.01); *G06F 3/0619* (2013.01); *G06F 3/0659* (2013.01); *G06F 11/1048* (2013.01); *G11C 2029/0411* (2013.01)

(58) Field of Classification Search
CPC .... G06F 3/0679; G06F 3/0619; G06F 3/0659; G06F 3/064
See application file for complete search history.

(56) References Cited

U.S. PATENT DOCUMENTS

| | | |
|---|---|---|
| 7,203,889 B2 | 4/2007 | Oza et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

FOREIGN PATENT DOCUMENTS

| | | |
|---|---|---|
| JP | 07105102 | 4/1995 |
| JP | 10097471 | 4/1998 |

(Continued)

OTHER PUBLICATIONS

Jangwoo Kim, et al., "Multi-bit Error Tolerant Caches Using Two-Dimensional Error Coding", 40th IEEE/ACM International Symposium on Microarchitecture, 2007, 197-209.

*Primary Examiner* — Sam Rizk
(74) *Attorney, Agent, or Firm* — F. Chau & Associates, LLC

(57) ABSTRACT

Provided are a memory device, a memory system, and a method of operating the memory device. A method of operating a memory device including a plurality of random access memory (RAM) chips includes inputting a read command, reading a plurality of pieces of block data including first block data corresponding to the read command from each of the plurality of RAM chips, generating two-dimensional (2D) data by combining the plurality of pieces of block data read from each of the RAM chips, and processing the read command by using the 2D data.

15 Claims, 25 Drawing Sheets

(56) References Cited

U.S. PATENT DOCUMENTS

| | | |
|---|---|---|
| 2006/0083096 A1* | 4/2006 | Yang .................. G11C 5/06 365/230.03 |
| 2006/0136800 A1 | 6/2006 | Kawabata et al. |
| 2008/0082869 A1 | 4/2008 | Sugawara |
| 2009/0193314 A1* | 7/2009 | Melliar-Smith .. H03M 13/2921 714/755 |
| 2011/0233648 A1 | 9/2011 | Seol et al. |

FOREIGN PATENT DOCUMENTS

| | | |
|---|---|---|
| JP | 11045595 | 2/1999 |
| JP | 2009295252 | 12/2009 |
| JP | 2010079485 | 4/2010 |
| JP | 2011238309 | 11/2011 |
| JP | 2013008425 | 1/2013 |
| KR | 1020130140504 | 12/2013 |

* cited by examiner

MEMORY DEVICE, MEMORY SYSTEM, AND METHOD OF OPERATING THE DEVICE

CROSS-REFERENCE TO RELATED APPLICATION

This application claims priority to Korean Patent Application No. 10-2015-0000858, filed on Jan. 5, 2015, in the Korean Intellectual Property Office, the disclosure of which is incorporated by reference in its entirety herein.

BACKGROUND

1. Technical Field

The inventive concept relates to a memory device, a memory system, and a method of operating the memory device, and more particularly, to a memory device, a memory system, and a method of operating the memory device, which improves reliability.

2. Discussion of Related Art

Due to an increase in integration density of memory devices and reductions in the sizes of the memory devices, errors are more likely to occur. Examples of these errors include reading the wrong data (i.e., reading data from a location in memory other than the actual data that was written to that location) or writing the wrong data (i.e., writing data to a location in memory other than the actual data that was intended to be written to the location). An error correcting technique can be used to correct these errors. However, the error correcting technique may use too much of the available space of the memory. Thus, there is a need for a method that improves the ability to correct errors.

SUMMARY

At least one embodiment of the inventive concept provides a memory device, a memory system, and a method of operating the memory device, which improves reliability.

According to an exemplary embodiment of the inventive concept, there is provided a method of operating a memory device including a plurality of random access memory (RAM) chips. The method includes inputting a read command, reading a plurality of pieces of block data including first block data corresponding to the read command from each of the plurality of RAM chips, generating two-dimensional (2D) data by combining a plurality of pieces of block data read from each of the RAM chips, and processing the read command by using the 2D data.

According to an exemplary embodiment of the inventive concept, there is provided a method of operating a memory system including a memory controller and a memory device. The method includes transmitting, by the memory controller, a read command to the memory device, generating first combination data including data read from the first storage region and the second storage region, in response to the read command, determining whether M errors are included in the first combination data, wherein N is a positive integer and M is a positive integer greater than N, reading a plurality of pieces of data including the data read from the first storage region and the second storage region when M errors is included in the first combination data, reconstructing second combination data, and processing errors in the first combination data by using the second combination data.

According to an exemplary embodiment of the inventive concept, there is provided a memory device including a plurality of storage regions configured to output first block data in response to the read command, and an error control circuit configured to determine whether 2D data including the first block data is to be generated, based on a result obtained by performing a single error correction-double error detection (SEC-DED) operation on 1D data generated by combining pieces of first block data that are respectively read from the plurality of storage regions.

According to an exemplary of the inventive concept, there is provided a memory system including a memory controller and a memory device. The memory device includes a plurality of memory chips, and an error control circuit configured to combine a plurality of pieces of user data stored in at least one of the plurality of memory chips and reconstruct 2D second combination data to perform an ECC operation when M errors are included in first combination data generated by combining pieces of user data that are respectively received from the plurality of memory chips, wherein N is a positive integer, and M is a positive integer greater than N.

According to an exemplary embodiment of the inventive concept, there is provided a method of operating a memory device including a plurality of random access memory (RAM) chips. The method includes: inputting a read command referencing an address of a first RAM chip among the RAM chips; generating one-dimensional (1D) data comprising a single row including a first data part of a word-line of each memory chip at the address; performing an error check and correct procedure on the 1D data to generate a result; and processing the read command using two-dimensional (2D) data when the result indicates a double error is present, where each column of the 2D data includes a different part of the word-line of the first RAM chip.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

The present inventive concept will now be described more fully hereinafter with reference to the accompanying drawings, in which exemplary embodiments are shown. Like numbers refer to like elements throughout.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 1:
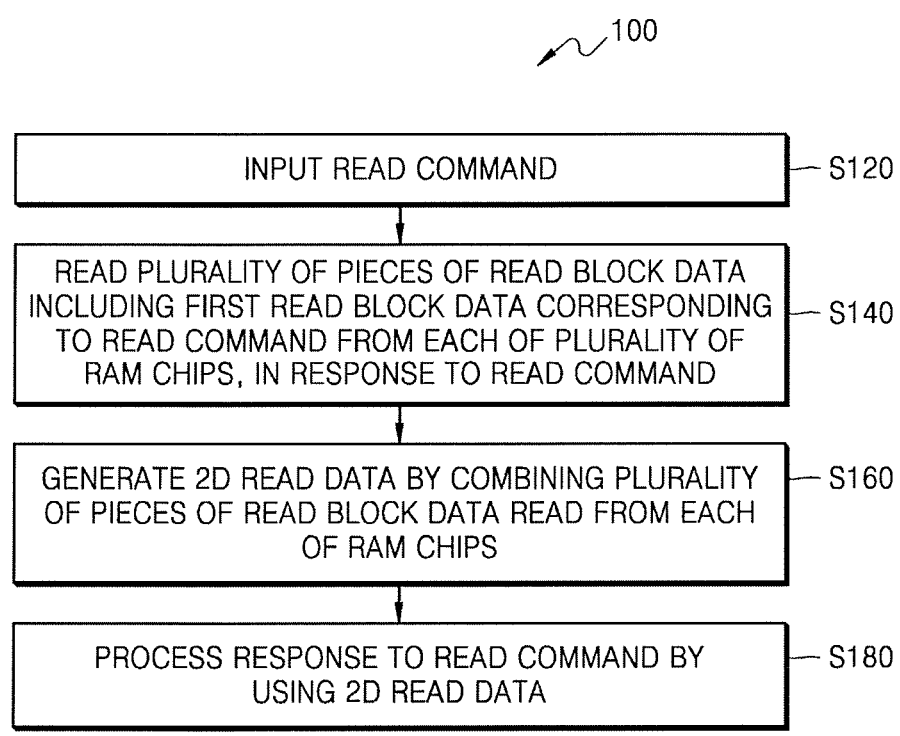
FIG. 1 is a flowchart of a method of operating a memory device according to an exemplary embodiment of the inventive concept.

FIG. 1 is a flowchart of a method 100 of operating a memory device according to an exemplary embodiment of the inventive concept. Referring to FIG. 1, the method 100 of operating the memory device according to an exemplary embodiment includes inputting a read command (S120), reading a plurality of pieces of read data including first read block data corresponding to the read command, from each of a plurality of random access memory (RAM) chips, in response to the read command (S140), generating two-dimensional (2D) read data by combining the plurality of pieces of the read block data read from each of the RAM chips (S160), and processing a response to the read command by using the 2D read data (S180).

Figure 2:
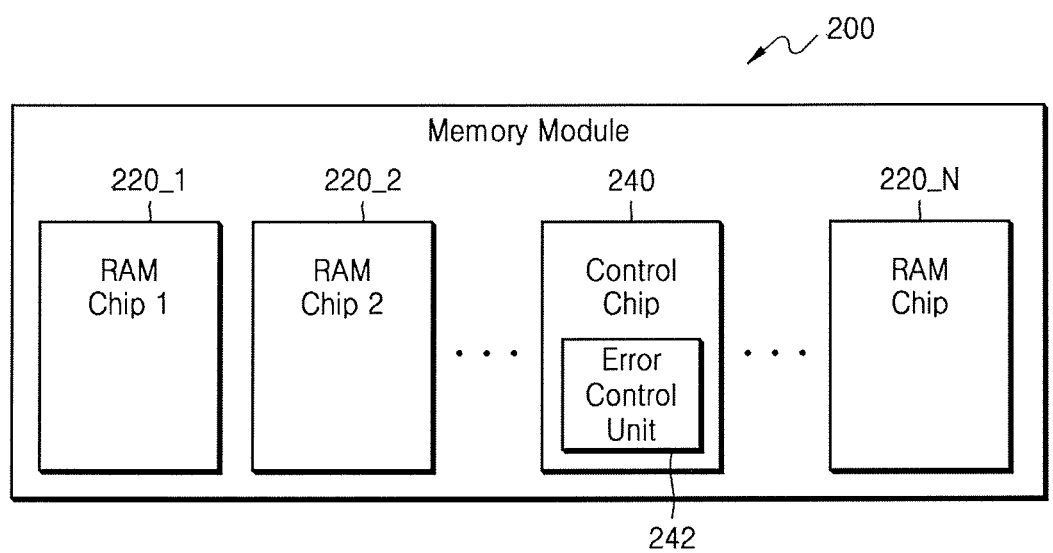
FIG. 2 is a diagram of a memory device according to an exemplary embodiment of the inventive concept.

FIG. 2 is a diagram of a memory device 200 according to an exemplary embodiment of the inventive concept. Referring to FIG. 2, the memory device 200 includes a plurality of RAM chips 220_1, 220_2, . . . , and 220_N. Each of the RAM chips 220_1, 220_2, . . . , and 220_N may be embodied by dynamic random access memory (DRAM), static RAM (SRAM), magnetic RAM (MRAM), ferroelectric RAM (FRAM), or resistive RAM (RRAM). The plurality of RAM chips 220_1, 2202, . . . , and 220_N may be RAM chips of the same kind, and at least one of the plurality of RAM chips 220_1, 220_2, . . . , and 220_N may be a different kind of RAM chip. For example, a first RAM chip 220_1 of the plurality of RAM chips 220_1, 220_2, . . . , and 220_N may be an MRAM chip, and the remaining RAM chips may be DRAM chips.

The memory device 200 may further include a control chip 240 configured to control each of the RAM chips 220_1, 220_2, . . . , and 220_N. The control chip 240 may receive an externally applied command and control an operation of each of the RAM chips 220_1, 220_2, . . . , and 220_N. For example, the control chip 240 may process errors in data to be written or read in response to an externally applied write command or read command. To this end, the control chip 240 may include an error control unit 242 (e.g., an error control circuit). However, the error control unit 242 may be included as an additional logic unit in the memory device 200 instead of in the control chip 240. The error control unit 242 will be described in detail below. Although shown in FIG. 2, the memory device 200 according to an exemplary embodiment may not include the control chip 240, and a control logic unit may be included in each of the RAM chips 220_1, 220_2, . . . , and 220_N and may function as the control chip 240.

The method 100 of operating the memory device of FIG. 1 may be performed by the memory device 200 of FIG. 2. A method of operating the memory device 200 according to an exemplary embodiment will now be described in detail with reference to FIGS. 1 and 2. When a buffer command is input to the memory device 200 (S120), each of the RAM chips 220_1, 220_2, . . . , and 220_N reads data stored at a read address that is transmitted along with a read command or included in the read command (S140). For brevity, data to be read in response to the read command will be referred to as first read block data.

Figure 3:
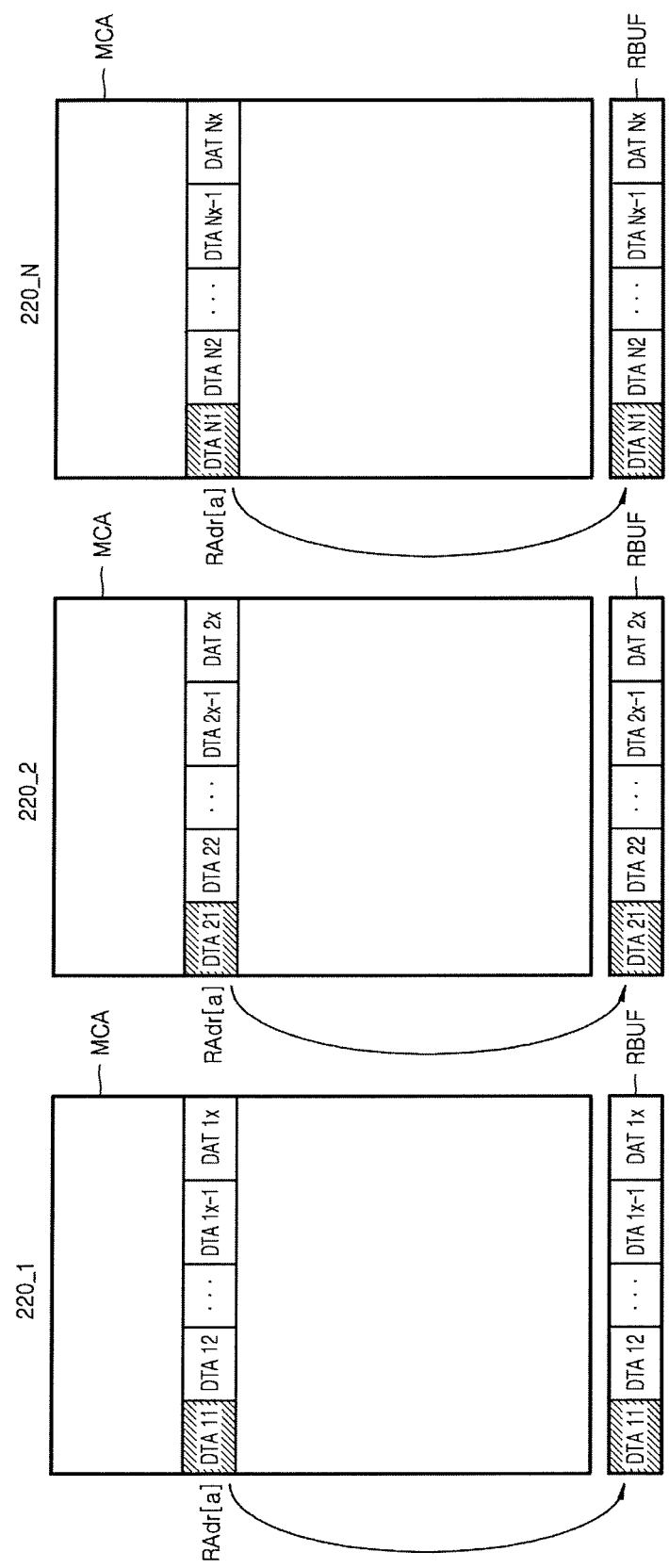
FIG. 3 is a diagram of a read operation of random access memory (RAM) chips shown in FIG. 2.

FIG. 3 is a diagram of a read operation in each of the RAM chips 220_1, 220_2, . . . , and 220_N of FIG. 2. Referring to FIG. 3, each of the RAM chips 220_1, 220_2, . . . , and 220_N includes a memory cell array MCA and a row buffer RBUF. In an exemplary embodiment, the plurality of RAM chips 220_1, 220_2, . . . , and 220_N simultaneously and respectively load first read block data DTA11, DTA21, . . . , and DTAN1 stored at load read addresses into a row buffer RBUF. That is, in response to one read command, the plurality of RAM chips 220_1, 220_2, . . . , and 220_N simultaneously read the respective first read block data DTA11, DTA21, . . . , and DTAN1. The loading of the first read block data DTA11, DTA21, . . . , and DTAN1 into row buffers RBUF of the respective RAM chips 220_1, 220_2, . . . , and 220_N may be synonymous with the outputting of the first read block data DTA11, DTA21, . . . , and DTAN1 from the respective RAM chips 220_1, 220_2, . . . , and 220_N.

In an exemplary embodiment, the plurality of RAM chips 220_1, 220_2, . . ., and 220_N also respectively load pieces of data having the same row addresses as the first read block data DTA11, DTA21, . . . , and DTAN1 into the row buffer RBUF. For example, the first RAM chip 220_1 simultaneously loads pieces of data DTA11, DTA12, . . . , and DTA1$x$ stored in memory cells connected to a word line that is mapped to a row address RAdr[a] into the row buffer RBUF.

In an exemplary embodiment, in response to a read command using an address to reference a particular word-line within a single memory chip among a plurality of memory chips, at substantially the same time, a first part of the data at the same word-line within each memory chip is copied to a different row buffer. For example, when two memory chips are present, if the read command uses a row address Radr[a] associated with a given word-line of the first RAM chip 220_1, then at substantially the same time, a first part of the data of the word-line in the first RAM chip 220_1 (e.g., DTA11) is copied to the row buffer of the first RAM chip 220_1 and a first part of the data of the word-line in the second RAM chip 220_2 (e.g., DTA21) is copied to the row buffer of the second RAM chip 220_1. The first parts may be located at a same relative position within the word-line in each of the RAM chips. In an exemplary embodiment, in response to the read command, additional parts of the respective words lines are copied to the respective row buffers with the first parts. For example, when two memory chips are present, if the read command uses a row address Radr[a] associated with a given word-line of the first RAM chip 220_1, then at substantially the same time, a first part and a second part of the data of the word-line in the first RAM chip 220_1 (e.g., DTA11 and DTA12) are copied to the row buffer of the first RAM chip 220_1 and a first part and a second part of the data of the word-line in the second RAM chip 220_2 (e.g., DTA21 and DTA22) are copied to the row buffer of the second RAM chip 220_1. The additional parts copied may include all the parts of the word-line.

The pieces of data that are simultaneously loaded by the RAM chips 220_1, 220_2, . . ., and 220_N into the row buffer RBUF in response to the read command may be referred to as a plurality of pieces of read block data. Accordingly, the plurality of pieces of read block data may include the first read block data corresponding to the read command. Although FIG. 3 illustrates a case in which all pieces of data having the same row address are simultaneously loaded into the row buffer RBUF, the inventive concept is not limited thereto. In an exemplary embodiment, only some pieces of data having the same row address are loaded into the row buffer RBUF.

Referring back to FIGS. 1 and 2, the error control unit 242 of the control chip 240 combines a plurality of pieces of read block data read from the respective RAM chips 220_1, 220_2, . . ., and 220_N to generate 2D read data (S160). For example, the error control unit 242 may combine the plurality of pieces of read block data DTA11, DTA12, . . . , and DTA1$x$ of the first RAM chip 220_1 to generate the 2D read data. For example, the error control unit 242 may sequentially or simultaneously generate 2D read data associated with each of the RAM chips 220_1, 220_2, . . ., and 220_N. The 2D read data may refer to data having bits formed in rows and columns. However, the 2D read data is not limited to data generated by combining a plurality of pieces of read data of the same RAM chip. For example, the 2D read data may be generated by using read block data of different RAM chips. Alternatively, the 2D read data may be generated by using the first read block data of each RAM chip. However, it will be assumed for brevity that 2D read data is generated by using a plurality of pieces of first block data of the same RAM chip.

Figure 4:
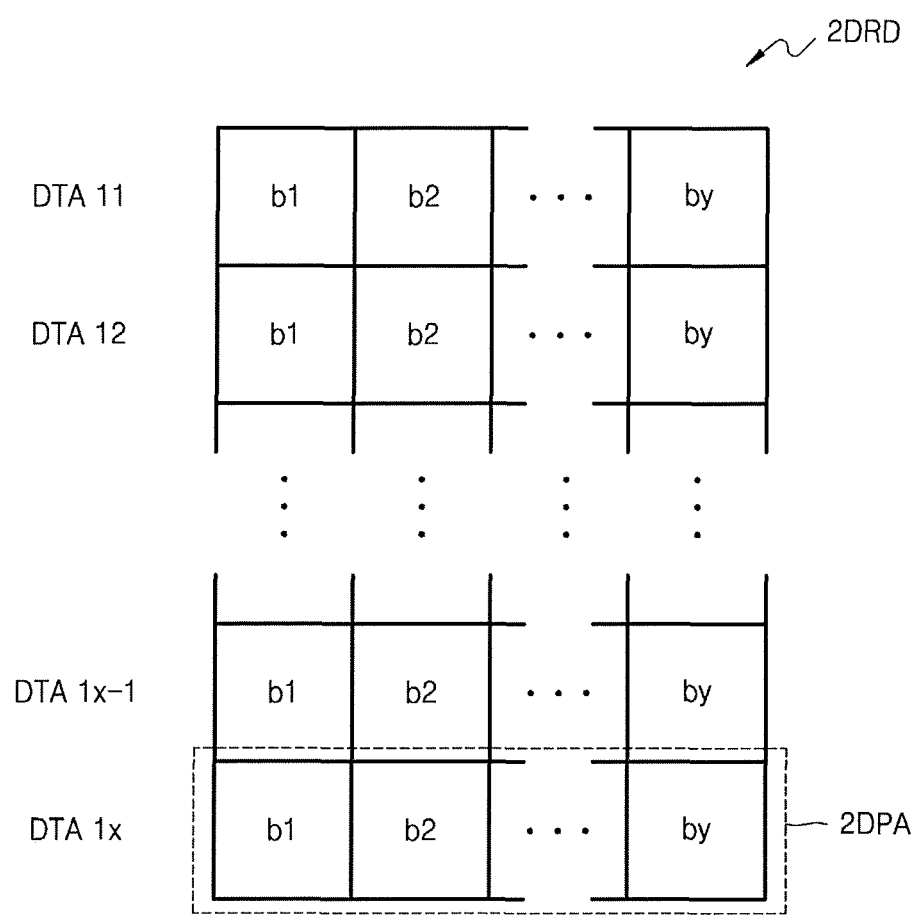
FIG. 4 is a diagram of two-dimensional (2D) read data according to an exemplary embodiment of the inventive concept.

FIG. 4 is a diagram of 2D read data of the first RAM chip 220_1, according to an exemplary embodiment of the inventive concept. Referring to FIG. 4, the 2D read data 2DRD of the first RAM chip 220_1 may be generated such that a plurality of pieces of read block data DTA11, DTA12, . . . , and DTA1$x$ of the first RAM chip 220_1 respectively form different rows. Specifically, read block data DTA11 may form a first row R1 of the 2D read data 2DRD, read block data DTA12 may form a second row R2 of the 2D read data 2DRD, and read block data DTA1$x$ may form an x-th row Rx of the 2D read data 2DRD. In this case, bits of the plurality of pieces of read block data DTA11, DTA12, . . . , and DTA1$x$, which are in the same position, form a column of the 2D read data 2DRD. For example, first bits b1 of the plurality of pieces of read block data DTA11, DTA12, . . . , and DTA1$x$ may form a first column C1 of the 2D read data 2DRD, second bits b2 of the plurality of pieces of read block data DTA11, DTA12, . . . , and DTA1$x$ may form a second column C2 of the 2D read data 2DRD, and final bits by of the plurality of pieces of read block data DTA11, DTA12, . . . , and DTA1$x$ may form a y-th column Cy.

In an exemplary embodiment, a row of data read from a given row address of a memory chip in response to a read command with the row address is converted into a column of multi-bit data referred to as 2D read data 2DRD. For example, if a row of data at the given row address includes DTA11 arranged at row1, column1, DTA12 arranged at row1, column2, DTA1X−1 arranged at row1, column3, and DTA1X arranged at row1, column4, the 2D read data 2DRD includes DTA11 arranged at row1, column1, DTA12 arranged at row2, column1, DTA1X−1 arranged at row3, column 1, and DTA1X arranged at row4, column 1, where the last row (i.e., row 4) is parity data for the remaining data of the 2D read data 2DRD. In an exemplary embodiment, the 2D read data 2DRD includes additional rows from another one of the memory chips.

In an exemplary embodiment, read block data DTA1$x$ is parity data of different pieces of read block data DTA11, DTA12, . . . , and DTA1$x$−1. For brevity, the 2D read data 2DRD may refer to data generated by combining all of a plurality of pieces of read block data DTA11, DTA12, . . . , and DTA1$x$, or data including a plurality of pieces of read block data DTA11, DTA12, . . . , and DTA1$x$ except read block data DTA1$x$ serving as parity data. The parity data of the 2D read data 2DRD may refer to 2D parity data 2DPA.

Referring back to FIGS. 1 and 2, a response to the read command may be processed by using the generated 2D read data 2DRD (S180). A memory controller may apply a read command to the memory device 200, and receive the 2D read data 2DRD from the memory device 200.

Figure 5:
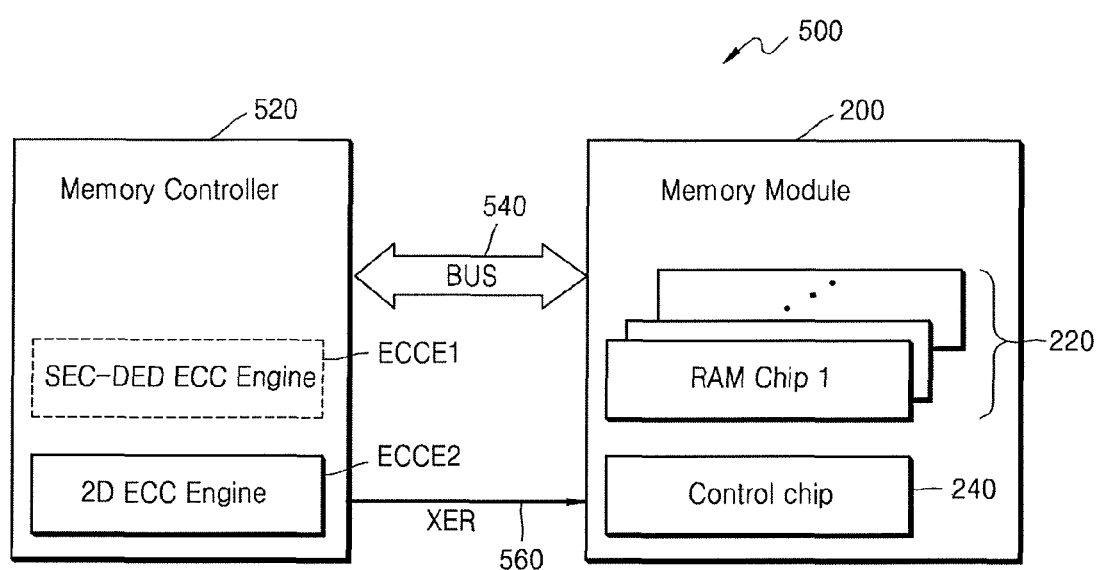
FIG. 5 is a diagram of a memory system according to an exemplary embodiment of the inventive concept.

FIG. 5 is a diagram of a memory system 500 according to an exemplary embodiment of the inventive concept. Referring to FIG. 5, the memory system 500 according to the exemplary embodiment includes a memory device 200 and a memory controller 520. As described above, the memory device 200 according to an exemplary embodiment may be embodied by a memory module including a plurality of RAM chips 220 and a control chip 240. The memory controller 520 may transmit a command, data, an address, and a control signal to the memory device 200. The command, data, and address may be transmitted through a bus 540 configured to electrically connect the memory controller 520 and the memory device 200. Also, the memory device 200 may transmit a response to a read command through the bus 540 to the memory controller 520. The bus 540 may include a wired or wireless communication channel. The control signal may be transmitted through a connection line 560 configured to electrically connect the memory controller 520 and the memory device 200. FIG. 5 illustrates an error signal XER as the control signal. The error signal XER may refer to a signal including information associated with detection and correction of errors.

The 2D read data 2DRD on which an error check and correction (ECC) operation is not performed may be transmitted through the bus 540 to the memory controller 520. Also, the memory controller 520 may perform an ECC operation on the 2D read data 2DRD. In this case, the memory device 200 may transmit the 2D read data 2DRD to the memory controller 520. 2D parity data 2DPA may be included in the 2D read data 2DRD, and the memory controller 520 may include a 2D ECC engine ECCE2 configured to perform an ECC operation on the 2D read data 2DRD. The memory controller 520 may extract first read block data (refer to DTA11, DTA21, . . . , and DTAN1 in FIG. 3) of the respective RAM chips 220_1, 220_2, . . . , and 220_N from errorless or error-corrected 2D read data 2DRD, and process the extracted first read block data as a response to the read command. In addition, the memory controller 520 may further include a 1D ECC engine ECCE1 configured to perform an ECC operation on 1D read data to be described below. An ECC operation of the memory controller 520 will be described in detail below.

FIG. 5 illustrates an example in which the 2D read data 2DRD on which an ECC operation is not performed is transmitted to the memory controller 520, but the inventive concept is not limited thereto. For example, 2D read data 2DRD on which an ECC operation is performed may be output from the memory device 200.

Figure 6:
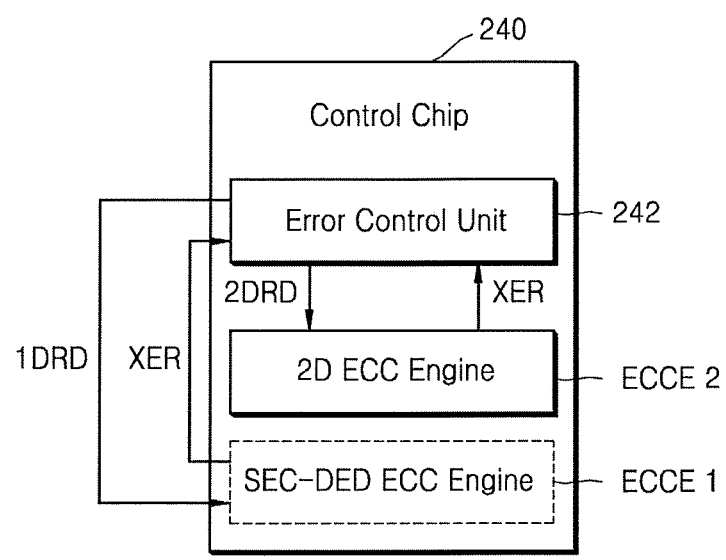
FIG. 6 is a diagram of a memory device according to an exemplary embodiment of the inventive concept.

FIG. 6 is a diagram of a control chip of a memory device according to an exemplary embodiment of the inventive concept. Referring to FIG. 6, the control chip 240 includes an error control unit 242 (e.g., an error control circuit) and a 2D ECC engine ECCE2. As described above, the error control unit 242 may generate 2D read data 2DRD. The 2D read data 2DRD may be applied to a 2D ECC engine ECCE2. The 2D ECC engine ECCE2 may detect errors in units of columns of 2D read data. For example, the 2D ECC engine ECCE2 may detect errors in a first column C1 of the 2D read data 2DRD of FIG. 4, detect errors in a second column C2 thereof, and detect errors in a y-th column Cy in the same manner. In addition, the 2D ECC engine ECCE2 may detect errors in units of rows of the 2D read data 2DRD. In the above-described manner, the 2D ECC engine ECCE2 is configured to detect a double error in the 2D read data 2DRD of each of the RAM chips 220_1, 220_2, . . . , and 220_N.

The 2D ECC engine ECCE2 may transmit a result obtained by performing a 2D ECC operation on the 2D read data 2DRD of each of the RAM chips 220_1, 220_2, . . . , and 220_N, as an error signal XER to the error control unit 242. The error control unit 242 may receive the error signal XER, extract first read block data DTA11, DTA21, . . . , and DTAN1 from the 2D read data 2DRD when each piece of the 2D read data 2DRD has no errors or when errors in each piece of the 2D read data 2DRD are corrected, and output the extracted first read block data as a response to the read command. In contrast, when errors in pieces of the 2D read data 2DRD are not corrected, the error control unit 242 may inform the memory controller 520 that a read operation is a failure. Even if all errors in the pieces of the 2D read data 2DRD are not corrected and if there is only one error, the error control unit 242 may extract the first read block data DTA11, DTA21, . . . , and DTAN1 from the 2D read data 2DRD and output the extracted first read block data as a response to the read command as described in detail later.

As described above, in the memory device 200 and the method 100 of operating the memory device 200 according to an exemplary embodiment, when multi-bit errors that may frequently occur due to an increase in the integration density of memory devices and the downscaling of memory devices, an overhead for generating parity data does not greatly increase unlike a case in which a Bose-Chaudhuri-Hocquenghem (BCH) method is applied. In the memory device 200 and the method 100 of operating the memory device according to an exemplary embodiment, when multi-bit errors do not occur, errors may be processed by a single error correction-double error detection (SEC-DED) process, so that an operation latency of the memory device 200 may be reduced as described below.

Figure 7:
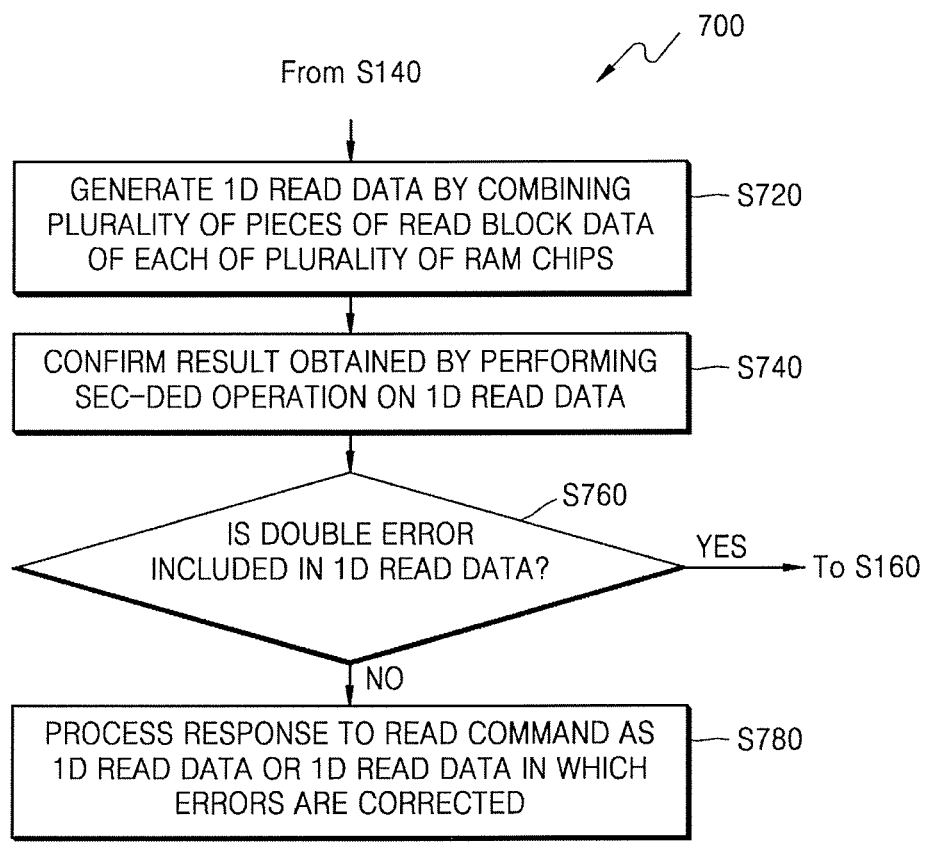
FIG. 7 is a flowchart of a method of operating a memory device according to an exemplary embodiment of the inventive concept.

FIG. 7 is a flowchart of a method 700 of operating a memory device according to an exemplary embodiment of the inventive concept. Referring to FIGS. 2 and 7, when a plurality of pieces of read block data including first read block data are respectively read from a plurality of RAM chips 220_1, 220_2, . . . , and 220_N in response to a read command (refer to S140 in FIG. 1), the method 700 of operating the memory device further includes generating 1D read data by combining a plurality of pieces of read block data of the plurality of chips 220_1, 220_2, . . . , and 220_N (S720) and confirming a result obtained by performing a SEC-DED operation on the 1D read data (S740) before generating the 2D read data 2DRD (S160). When a double error is included in the 1D read data (refer to YES in S760), as in the method 100 of operating the memory device of FIG. 1, the 2D read data 2DRD is generated (S160), and a response to the read command is processed by using the 2D read data 2DRD (S180). However, when the double error is not included in the 1D read data (refer to NO in S760), a response to the read command is processed as 1D read data or error-corrected 1D read data (S780).

Figure 8:
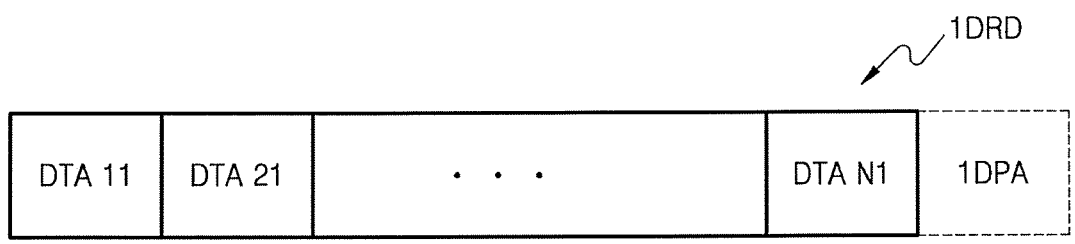
FIG. 8 is a diagram of one-dimensional (1D) read data according to an exemplary embodiment of the inventive concept.

FIG. 8 is a diagram of 1D read data according to an exemplary embodiment of the inventive concept. Referring to FIG. 8, the 1D read data 1DRD is generated by combining first read block data DTA11, DTA21, . . . , and DTAN1 of respective RAM chips 220_1, 220_2, . . . , and 220_N. That is, the first read block data DTA11, DTA21, . . . , and DTAN1 may be generated by combining first read block data DTA11, DTA21, . . . , and DTAN1 of a first RAM chip 220_1 and first read block data DTA11, DTA21, . . . , and DTAN1 of a second RAM chip 220_2. In an exemplary embodiment, 1D read data 1DRD is a single row of data generated from respective parts of rows of several of the RAM chips. As described above, the RAM chips 220_1, 220_2, . . . , and 220_N may simultaneously output first read block data DTA11, DTA21, . . . , and DTAN1 in response to one read command. Accordingly, even if the error control unit 242 does not perform an additional control operation, 1D read data 1DRD is generated in response to a read command.

The operation S740 of confirming the result obtained by performing the SEC-DED operation on the 1D read data 1DRD may be performed by the SEC-DED ECC engine ECCE1 of FIG. 6. The SEC-DED ECC engine ECCE1 transmits the result obtained by performing the SEC-DED operation on the 1D read data 1DRD as an error signal XER to the error control unit 242. When the error signal XER indicates that an error is not included in the 1D read data 1DRD or the error is corrected, the error control unit 242 outputs the 1D read data 1DRD as a response to the read command (S780). When the error signal XER indicates that a double error (or two error bits) is included in the 1D read data 1DRD, the error control unit 242 generates 2D read data 2DRD.

However, the inventive concept is not limited thereto. For example, as shown in FIG. 5 and FIG. 6, the error correction unit 242 of the memory device 200 may receive an error signal XER, which is a result obtained when the SEC-DED ECC engine ECCE1 of the memory controller 520 performs a SEC-DED operation on the 1D read data 1DRD. The SEC-DED ECC engine ECCE1 is capable of correcting one error included in the 1D read data 1DRD and detecting a two-bit error included in the 1D read data 1DRD. Thus, in the memory device 200 and the method 700 of operating the memory device according to an exemplary embodiment, ECC engines having different error correctabilities are sequentially applied to improve reliability without degrading operating characteristics of the memory device 200. Although FIG. 8 illustrates a case in which the 1D read data 1DRD includes parity data 1DPA associated with the 1D read data 1DRD, the inventive concept is not limited thereto, as the parity data 1DPA associated with the 1D read data 1DRD may be processed in addition to the 1D read data 1DRD.

Figure 9:
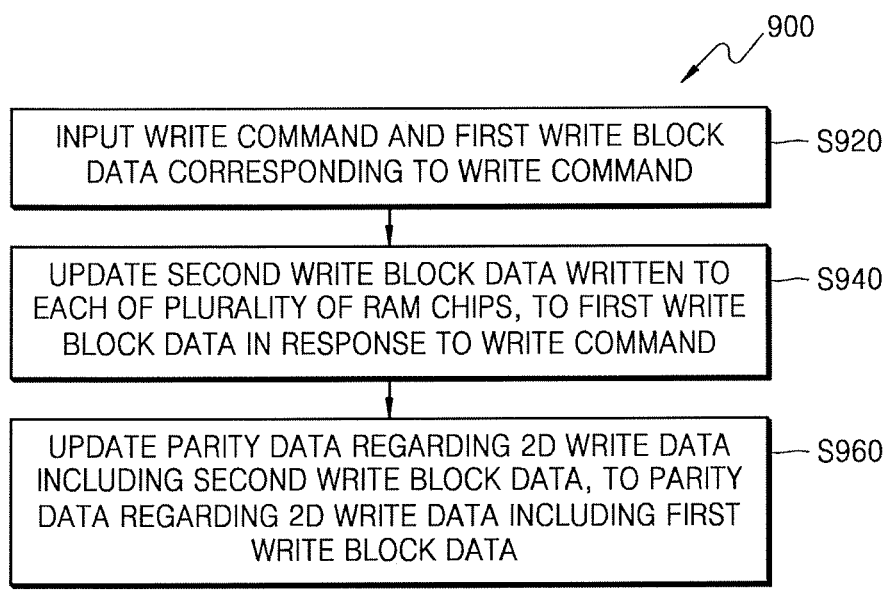
FIG. 9 is a flowchart of a method of operating a memory device according to an exemplary embodiment of the inventive concept.

FIG. 9 is a flowchart of a method 900 of operating a memory device 200 according to an exemplary embodiment of the inventive concept. Referring to FIGS. 2 and 9, the method 900 of operating the memory device 200 includes inputting a write command and first write block data corresponding to the write command (S920), updating second write block data written to each of a plurality of RAM chips 220_1, 220_2, . . . , and 220_N to the first write block data in response to the write command (S940) and updating parity data of 2D write data including the second write block data to parity data of 2D write data including the first write block data (S960).

The second write block data may indicate data stored at a write address of each of the RAM chips 220_1, 220_2, . . . , and 220_N, to which the first write block data is to be written in response to a write command. For example, when the write address indicates first blocks of row addresses RAdr[a] of the respective RAM chips 220_1, 220_2, . . . , and 220_N of FIG. 3, second write block data may be DTA11, DTA21, . . . , and DTAN1. In response to a write command, the second write block data DTA11, DTA21, . . . , and DTAN1 of the respective RAM chips 220_1, 220_2, . . . , and 220_N may be respectively updated to first write block. Thus, similar to the read operation, a write operation may be simultaneously performed on the respective RAM chips 220_1, 220_2, . . . , and 220N. First write block data, which are simultaneously written in response to one write command, may be referred to as 1D write data.

As described above, to process a response to the read command by using the 2D read data 2DRD, 2D parity data 2DPA may be generated and stored during the writing of data. Accordingly, the method 900 of operating the memory device 200 may include generating parity data associated with the 2D write data including the first write block data (S960).

Figure 10:
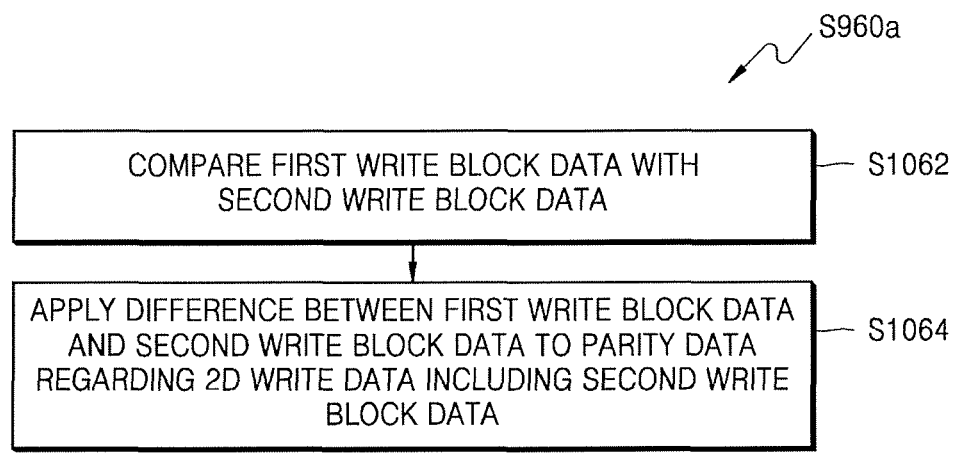
FIG. 10 is a flowchart of a method of updating parity data associated with 2D write data, according to an exemplary embodiment of the inventive concept.

FIG. 10 is a flowchart of a method of updating parity data of 2D write data, according to an exemplary embodiment of the inventive concept. Referring to FIG. 10, a method S960a of updating parity data associated with 2D write data including second write block data to parity data associated with 2D write data including first write block data includes comparing the first write block data with the second write block data (S1062) and applying a difference between the first write block data and the second write block data to the parity data associated with the 2D write data including the second write block data (S1064).

FIG. 11A-11D are diagrams of a write operation of a first RAM chip using the method of FIG. 10, according to an exemplary embodiment of the inventive concept.

Figure 11A:
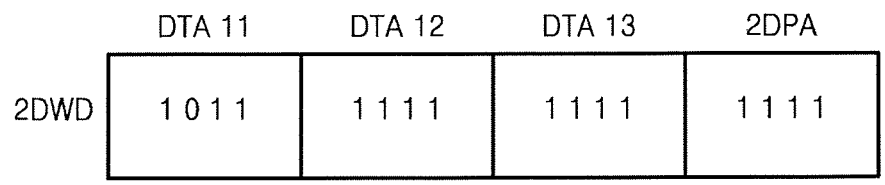
FIG. 11A, FIG. 11B, FIG. 11C, and FIG. 11D are diagrams of a write operation of a first RAM chip according to the method of FIG. 10, according to an exemplary embodiment of the inventive concept.

In FIG. 11A, it is assumed that a write command is applied when data DTA11, DTA12, and DTA13 and 2D parity data 2DPA associated with data DTA11, DTA12, and DTA13 are stored at a row address RAdr[a] of a memory cell array MCA of a first RAM chip 220_1. The data DTA11 may be referred to as second write block data. For brevity, data that includes first write block data DTA11' or second write block data DTA11 and is written at a row address of a write command is referred to as a plurality of pieces of write block data. The plurality of pieces of write block data are combined into 2D data and referred to as 2D write data. The 2D parity data refers to parity data associated with 2D write data.

Figure 11B:
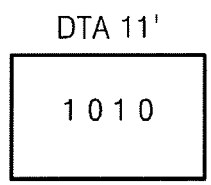

When a write command is applied to write first write block data DTA11', which corresponds to 1010 of FIG. 11B (S920), the error control unit 242 compares the first write block data DTA11' with the second write block data DTA11 (S1062). A comparison operation may be performed by performing, for example, a logic exclusive OR (XOR) operation may be performed on the first write block data DTA11' and the second write block data DTA11. For example, and XOR gate may be used to perform the XOR operation. Since the second write block data DTA11 is 1011 and the first write block data DTA11' is 1010, it may be confirmed that one bit value has changed. For example, the number of bits that remain set in the result of the XOR indicate how many bit values have changed.

Figure 11C:
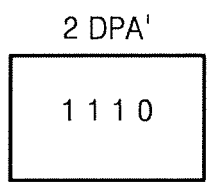
Figure 11D:
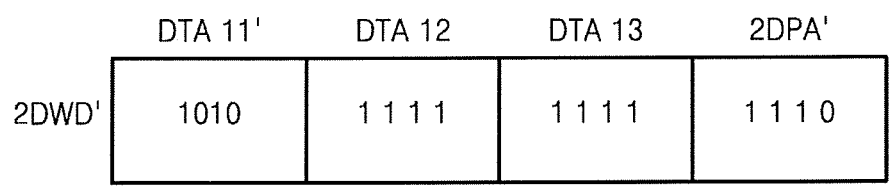

If a difference between the first write block data DTA11' and the second write block data DTA11 is confirmed to be 1, the error control unit 242 updates 2D parity data 2DPA associated with 2D write data 2DWD including the second write block data DTA11 based on the difference. As shown in FIG. 11C, since the 2D parity data 2DPA associated with the 2D write data 2DWD including the second write block data DTA11 is 1111, updated 2D parity data 2DPA' may have a value of 1110. For example, the difference may be subtracted from the 2D parity data 2DPA to generate the updated 2D parity data 2DPA'. As shown in FIG. 11D, the updated 2D parity data 2DPA' may be parity data associated with 2D write data 2DWD' including the first write block data DTA11'. The first write block data DTA11' and the 2D parity data 2DPA' may be written to the memory cell array MCA.

Figure 12:
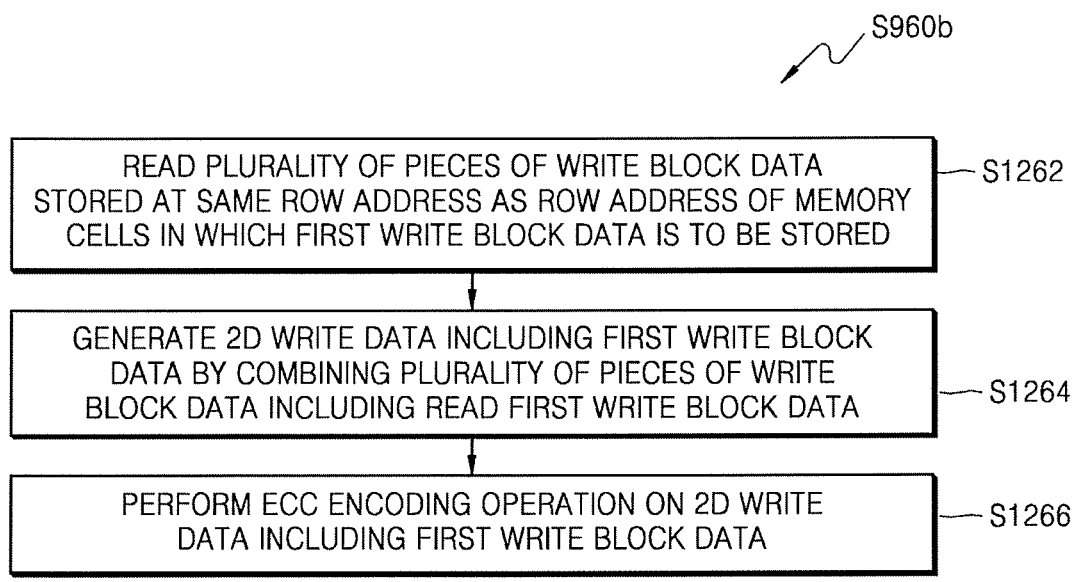
FIG. 12 is a flowchart of a method of updating parity data associated with 2D write data, according to an exemplary embodiment of the inventive concept.

FIG. 12 is a flowchart of updating parity data associated with 2D write data, according to an exemplary embodiment of the inventive concept. Referring to FIG. 12, an operation S960b of generating parity data associated with 2D write data including first write block data includes reading a plurality of pieces of write block data stored at the same row address as a row address of memory cells in which first write block data is to be stored (S1262), generating 2D write data including the first write block data by combining the plurality of pieces of write block data including the read first write block data (S1264), and performing an ECC encoding operation on the 2D write data including the first write block data (S1266).

Figure 13:
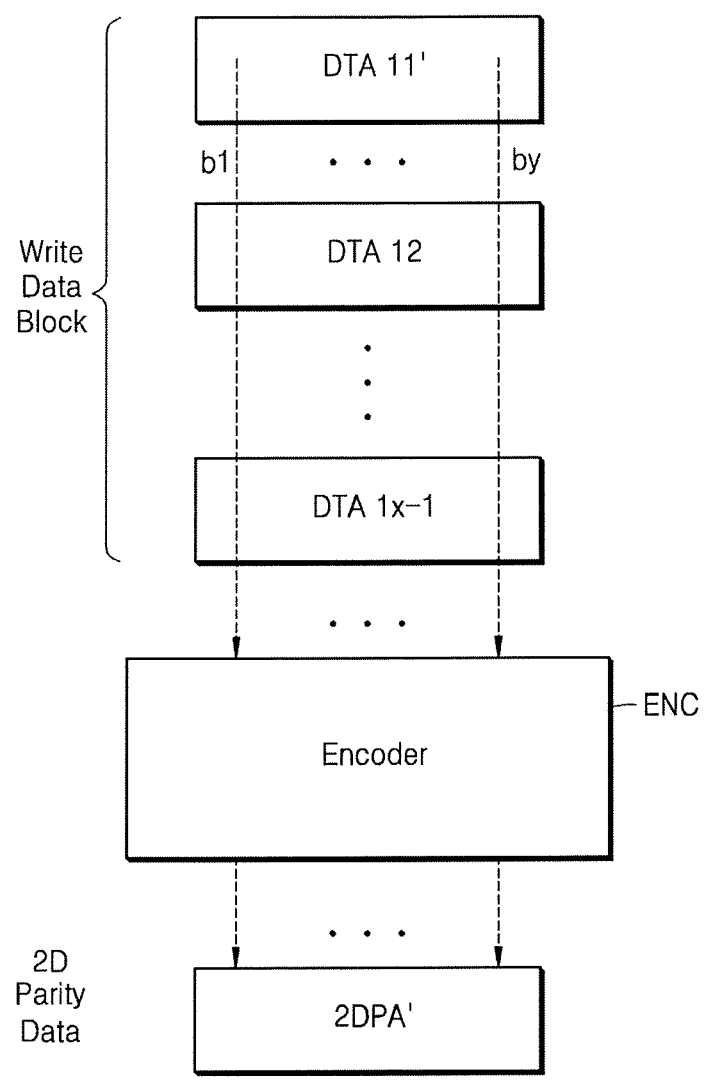
FIG. 13 is a diagram of a write operation of a first RAM chip according to the method of FIG. 12, according to an exemplary embodiment of the inventive concept.

FIG. 13 is a diagram of a write operation of a first RAM chip using the method of FIG. 10, according to an exemplary embodiment of the inventive concept. Referring to FIG. 13, the error control unit 242 combines a plurality of pieces of write block data DTA11', DTA12, . . . , and DTA1x−1 including first write block data DTA11' and generate 2D write data. As described above, 2D data may be generated by forming respective pieces of block data in different rows. In an embodiment, an encoder ENC included in the error control unit 242 encodes respective columns of the 2D write data and generates 2D parity data 2DPA' associated with 2D write data including first write block data DTA11'.

Figure 14:
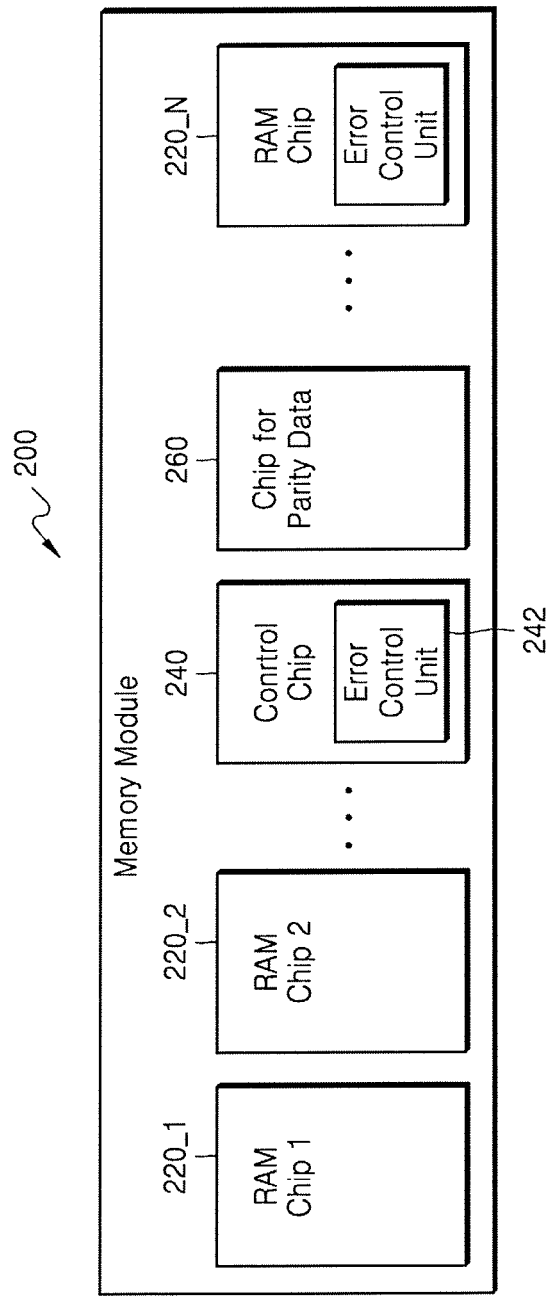
FIG. 14 is a diagram of a memory device according to an exemplary embodiment of the inventive concept.

Parity data associated with 2D data generated in the above-described method may be written to a memory cell array MC of each of the RAM chips 220_1, 220_2, . . . , and 220_N. According to the above-described example of FIG. 3, parity data 2DPA or 2DPA' associated with 2D data may be stored at the same row address as the 2D data. However, the inventive concept is not limited thereto. Referring to FIG. 14, which illustrates a memory device 200 according to an exemplary embodiment, the memory device 200 further includes a chip 260 configured to store parity data. For example, the chip 260 may be dedicated to only storing parity data. The chip 260 configured to store the parity data may include a region in which parity data associated with 1D data (1D read data and 1D write data) is stored. Furthermore, the chip 260 may include a region in which parity data associated with 2D data (2D read data and 2D write data) is stored.

Figure 15:
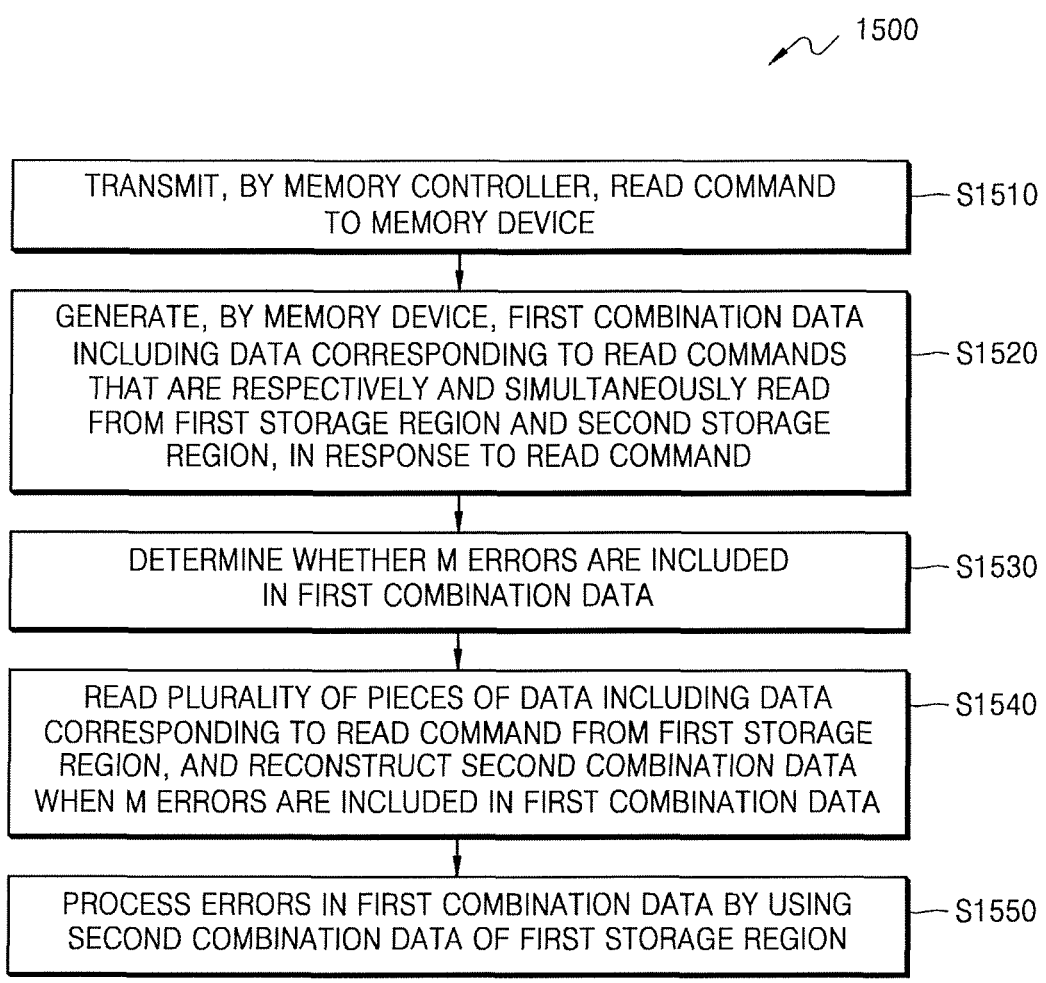
FIG. 15 is a flowchart of a method of operating a memory system according to an exemplary embodiment of the inventive concept.

FIG. 15 is a flowchart of a method 1500 of operating a memory system according to an exemplary embodiment of the inventive concept. Referring to FIG. 15, the method 1500 of operating the memory system according to an exemplary embodiment includes transmitting, by a memory controller, a read command to a memory device (S1510), generating, by the memory device, first combination data including pieces of data, which are respectively and simultaneously read from a first storage region and a second storage region and corresponding to the read command, in response to the read command (S1520), determining whether M errors greater than N errors are included in the first combination data (S1530), reading a plurality of pieces of data including data corresponding to the read command from the first storage region and reconstructing second combination data when the M errors are included in the first combination data (S1540), and processing errors in the first combination data by using second combination data associated with the first storage region (S1550). The method 1500 of operating the memory system may be performed by the memory system of FIG. 16. In an embodiment, N is a positive integer, and M is a positive integer greater than N.

Figure 16:
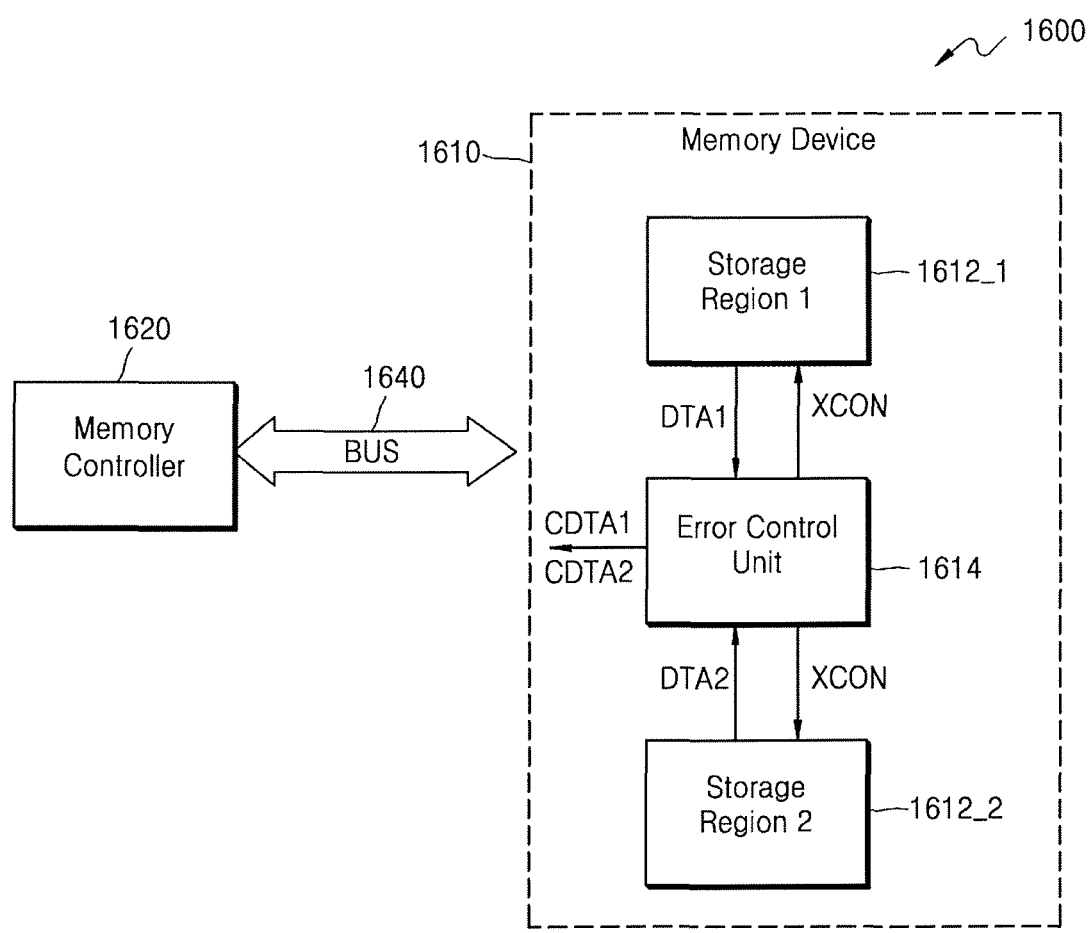
FIG. 16 is a diagram of a memory system according to an exemplary embodiment of the inventive concept.

FIG. 16 is a diagram of a memory system 1600 according to an exemplary embodiment of the inventive concept. Referring to FIG. 16, the memory system 1600 according to an exemplary embodiment includes a memory device 1610, a memory controller 1620, and a bus 1640 configured to electrically connect the memory device 1610 and the memory controller 1620. The memory controller 1620 may apply a command, data, an address, and a control signal for controlling an operation of the memory device 1610 to the memory device 1610. The memory device 1610 may execute an operation under the control of the memory controller 1620. In response to an arbitrary operation, the memory device 1610 may transmit an operation result to the memory controller 1620. For example, the memory controller 1620 may transmit a read command through the bus 1640 to the memory device 1610, and the memory device 1610 may transmit read data through the bus 1640 to the memory controller 1620 in response to the read command.

The memory device 1610 includes a first storage region 1612_1, a second storage region 1612_2, and an error control unit 1614. The first storage region 1612_1 and the second storage region 1612_2 respectively include regions configured to store user data DTA1 and DTA2. The user data DTA1 and DTA2 may be respectively stored in the first storage region 1612_1 and the second storage region 1612_2 in response to a write command of the memory controller 1620. When the read command is transmitted to the memory device 1610 (refer to S1510 in FIG. 15), the first storage region 1612_1 and the second storage region 1612_2 respectively output the user data DTA1 and DTA2 in response to the read command. In this case, the writing of the user data DTA1 and DTA2 to the first storage region 1612_1 and the second storage region 1612_2 may be simultaneously performed in response to one write command.

Similarly, the reading of the user data DTA1 and DTA2 from the first storage region 1612_1 and the second storage region 1612_2 may be simultaneously performed in response to one read command. The first storage region 1612_1 and the second storage region 1612_2 may be variously embodied depending on how to determine regions configured to simultaneously output user data in response to one read command. When the memory device 1610 is embodied by a memory module as shown in FIG. 3, the first storage region 1612_1 and the second storage region 1612_2 may be the first RAM chip 220_1 and the second RAM chip 220_2, respectively. However, the memory device 1610 may further include a storage region other than the first storage region 1612_1 and the second storage region 1612_2. The storage region other than the first storage region 1612_1 and the second storage region 1612_2 may be a RAM chip other than the first RAM chip 220_1 and the second RAM chip 220_2 of FIG. 3.

Figure 17:
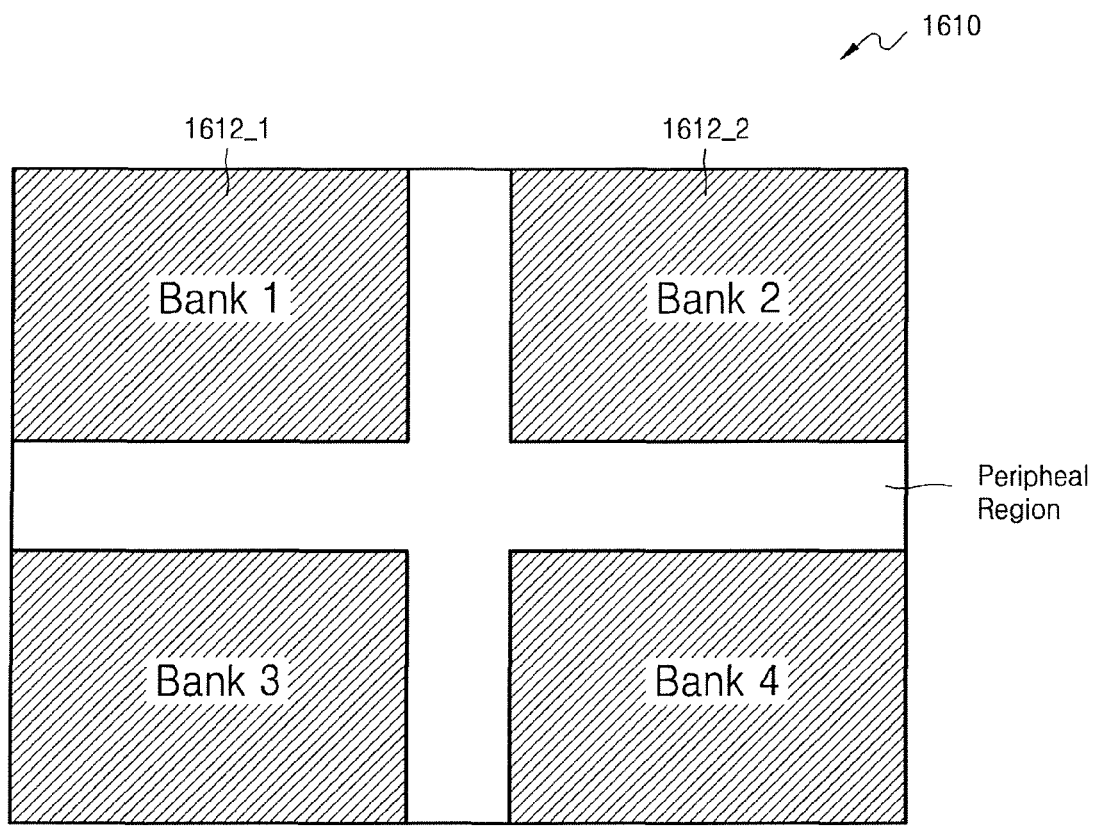
FIGS. 17 and 18 are diagrams of a memory device of FIG. 16, according to an exemplary embodiments of the inventive concept.
Figure 19:
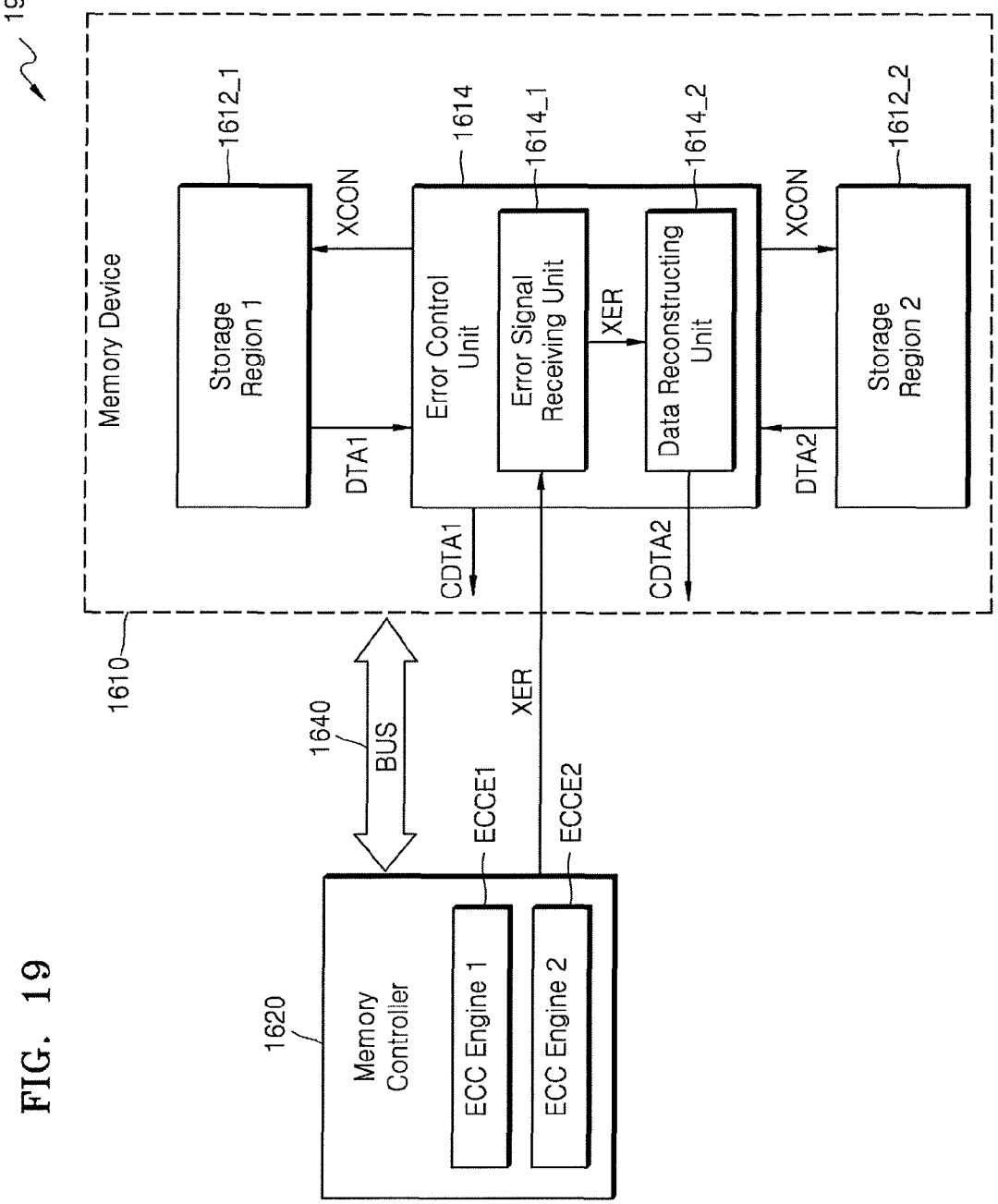
FIG. 19 is a diagram of a memory system according to an exemplary embodiment of the inventive concept.

Alternatively, when the memory device 1610 is embodied by a memory chip as shown in FIG. 19, each of the first storage region 1612_1 and the second storage region 1612_2 may be embodied by a bank included in a memory chip. As shown in FIG. 17, when the memory device 1610 includes four banks, the first storage region 1612_1 may be embodied by a first bank, and the second storage region 1612_2 may be embodied by a second bank. Alternatively, the first storage region 1612_1 may be embodied by a first bank and a third bank, and the second storage region 1612_2 may be embodied by a second bank and a fourth bank. In the memory 1610 of FIG. 17, the error control unit 1614 may be included in a peripheral region.

Figure 18:
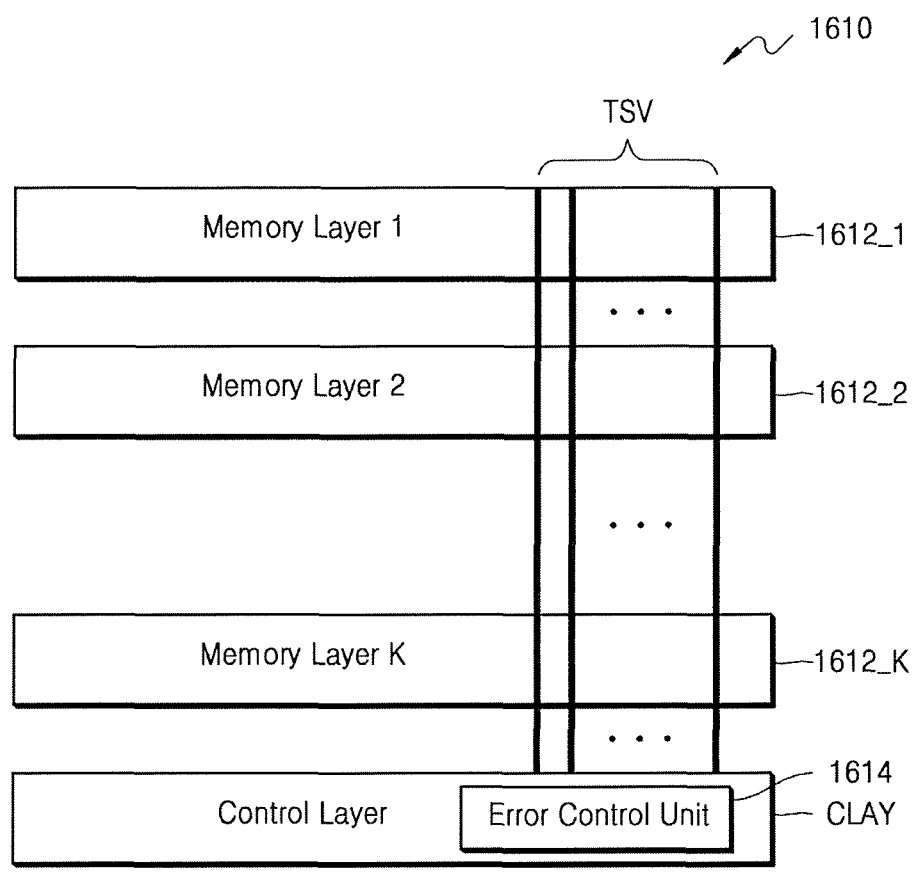

Alternatively, when the memory device 1610 is embodied by a stack-type memory module including a plurality of memory layers as shown in FIG. 18, each of the first storage region 1612_1 and the second storage region 1612_2 is embodied by a memory layer included in the stack-type memory module. In the memory device 1610 shown in FIG. 18, the first storage region 1612_1 is embodied by a first memory layer, and the second storage region 1612_2 is embodied by a second memory layer. Alternatively, the memory device 1610 may further include a storage region other than the first storage region 1612_1 and the second storage region 1612_2. The storage region other than the first storage region 1612_1 and the second storage region 1612_2 may be embodied by another memory layer.

The transmission of commands or data to each of the memory layers may be performed by a through-silicon via (TSV). The memory device 1610 of FIG. 18 may further include a control layer CLAY configured to control an operation of each of the memory layers. The error control unit 1614 may be included in the control layer CLAY. However, the inventive concept is not limited thereto. In an embodiment, the memory device 1610 does not include an additional control layer CLAY, and instead each of the memory layers includes control logic configured to function as a control layer. In this case, the error control unit 1614 may also be included in an arbitrary memory layer.

Referring back to FIG. 16, user data DTA1 and DTA2 that are simultaneously output from the first storage region 1612_1 and the second storage region 1612_2, which are described above in one example, in response to one read command, will be referred to as first combination data CDTA1. The first combination data CDTA1 may correspond to the 1D read data 1DRD of FIG. 8. The memory device 1610 may combine the user data DTA1 and DTA2, which are simultaneously read from the first storage region 1612_1 and the second storage region 1612_2, respectively, in a data queue (not shown) or a buffer (not shown) and generate the first combination data CDTA1 (refer to S1520 in FIG. 15). FIG. 16 illustrates an example in which the error control unit 1614 receives the user data DTA1 and DTA2 from the first storage region 1612_1 and the second storage region 1612_2, respectively, and outputs the first combination data CDTA1, but the inventive concept is not limited thereto. As described above, the first combination data CDTA1 may be generated due to a standard specification of a RAM.

The error control unit 1614 may determine whether M errors (M is a positive integer greater than N) are included in the first combination data CDTA1 (refer to S1530 in FIG. 3). In this case, N refers to the number of bits that can be corrected by an ECC engine configured to perform an ECC operation on the first combination data CDTA1, and M refers to the number of bits that can be detected by the ECC engine configured to perform the ECC operation on the first combination data CDTA1. Since the SEC-DED ECC engine ECCE1 described above with reference to FIG. 5 can correct a 1-bit error and detect a 2-bit error, N may be 1, and M may be 2. However, the inventive concept is not limited thereto, and N may have a value other than 1, and M may have a value other than 2. It may be determined whether M errors greater than N errors are included in the first combination data CDTA1, based on a result obtained by performing the ECC operation on the first combination data CDTA1.

When M errors greater than N errors are included in the first combination data CDTA1, the error control unit 1614 applies a control signal XCON to the first storage region 1612_1 and the second storage region 1612_2 and controls second combination data CDTA2 to be generated (refer to S1540 in FIG. 15). Since the generation of the second combination data CDTA2 or reconstruction of the second combination data CDTA2 may be similar to that of the 2D read data 2DRD described above with reference to FIGS. 3 and 4, detailed descriptions thereof are omitted here.

A memory system 1900 may perform an ECC operation on the second combination data CDTA2 and process errors in the first combination data CDTA1 (refer to S1550 in FIG. 15). An ECC operation may be performed on the first combination data CDTA1 and the second combination data CDTA2 by the memory controller 1620 or the memory device 1610. Initially, a case in which an ECC operation is performed on the first combination data CDTA1 and the second combination data CDTA2 by the memory controller 1620 will be described.

Figure 20:
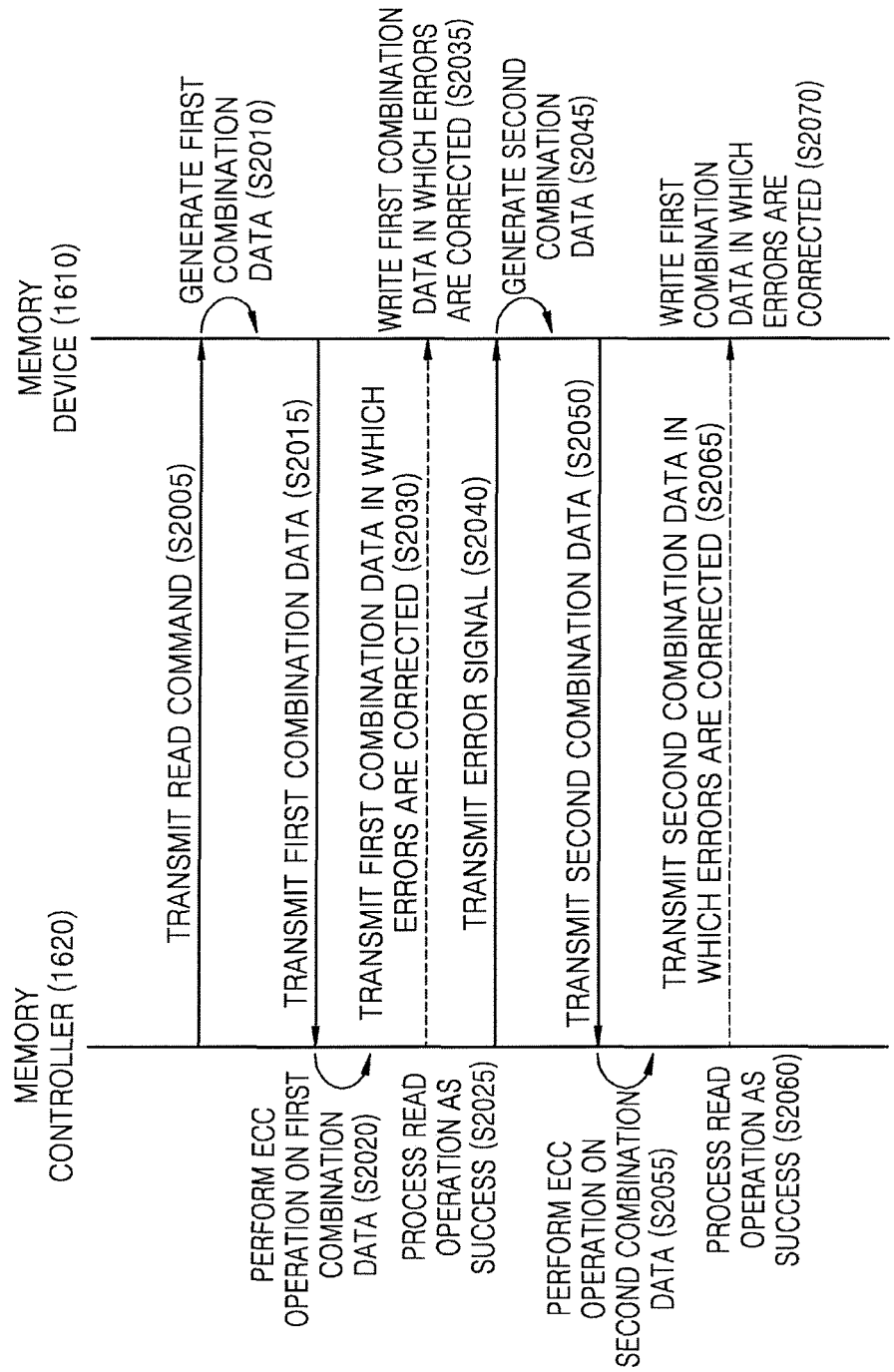
FIGS. 20 and 21 are flow diagrams of a method of operating the memory system of FIG. 19, according to exemplary embodiments of the inventive concept.

FIG. 19 is a diagram of a memory system 1900 according to an exemplary embodiment of the inventive concept, and FIG. 20 is a diagram of a method of operating the memory system 1900 of FIG. 19, according to an exemplary embodiment of the inventive concept. Referring to FIGS. 19 and 20, a memory controller 1620 of the memory system 1900 includes a first ECC engine ECCE1 and a second ECC engine ECCE2. When the memory controller 1620 transmits a read command to the memory device 1610 (S2005), the memory device 1610 generates first combination data CDTA1 (S2010), and transmits the first combination data CDTA1 to the memory controller 1620 (S2015). The first ECC engine ECCE1 configured to correct an N-bit error and detect an M-bit error performs an ECC operation on the first combination data CDTA1 (S2020). When N errors or fewer are included in the first combination data CDTA1, the first ECC engine ECCE1 corrects the errors in the first combination data CDTA1 and processes a read operation as a success (S2025). The first combination data CDTA1 in which errors are corrected are transmitted to the memory device 1610 (S2030), and written to the memory device 1610 (S2035). In contrast, when M errors (M is a positive integer greater than N) are included in the first combination data CDTA1, the first ECC engine ECCE1 transmits an error signal XER indicating the inclusion of the M errors in the first combination data CDTA1, to the memory device 1610 (S2040).

An error signal receiving unit 1614_1 of the memory device 1610 may receive the error signal XER and inform a data reconstructing unit 1614_2 that the M errors greater than the N errors are included in the first combination data CDTA1. Thus, the data reconstructing unit 1614_2 generates second combination data CDTA2 associated with the first storage region 1612_1 (S2045), and transmits the second combination data CDTA2 to the memory controller 1620 (S2050). The second ECC engine ECCE2 configured to perform a 2D ECC operation on the memory controller 1620 performs an ECC operation on the second combination data CDTA2 of the first storage region 1612_1 (S2055). Since the 2D ECC operation on the second combination data CDTA2 of the first storage region 1612_1 may be similar to the above-described ECC operation on the 2D read data 2DRD, detailed descriptions thereof are omitted.

When errors in the second combination data CDTA2 of the first storage region 1612_1 are corrected, a read operation is processed as a success (S2025). Also, first combination data CDTA1 extracted from the second combination data CDTA2 in which the errors are corrected or the second combination data CDTA2 in which the errors are corrected are transmitted to the memory device 1610 (S2065), and the first combination data CDTA1 in which the errors are corrected are written to the memory device 1610. However, in this case, the write operation is not performed in response to a write command but processed as an operation in response to a read command.

Figure 21:
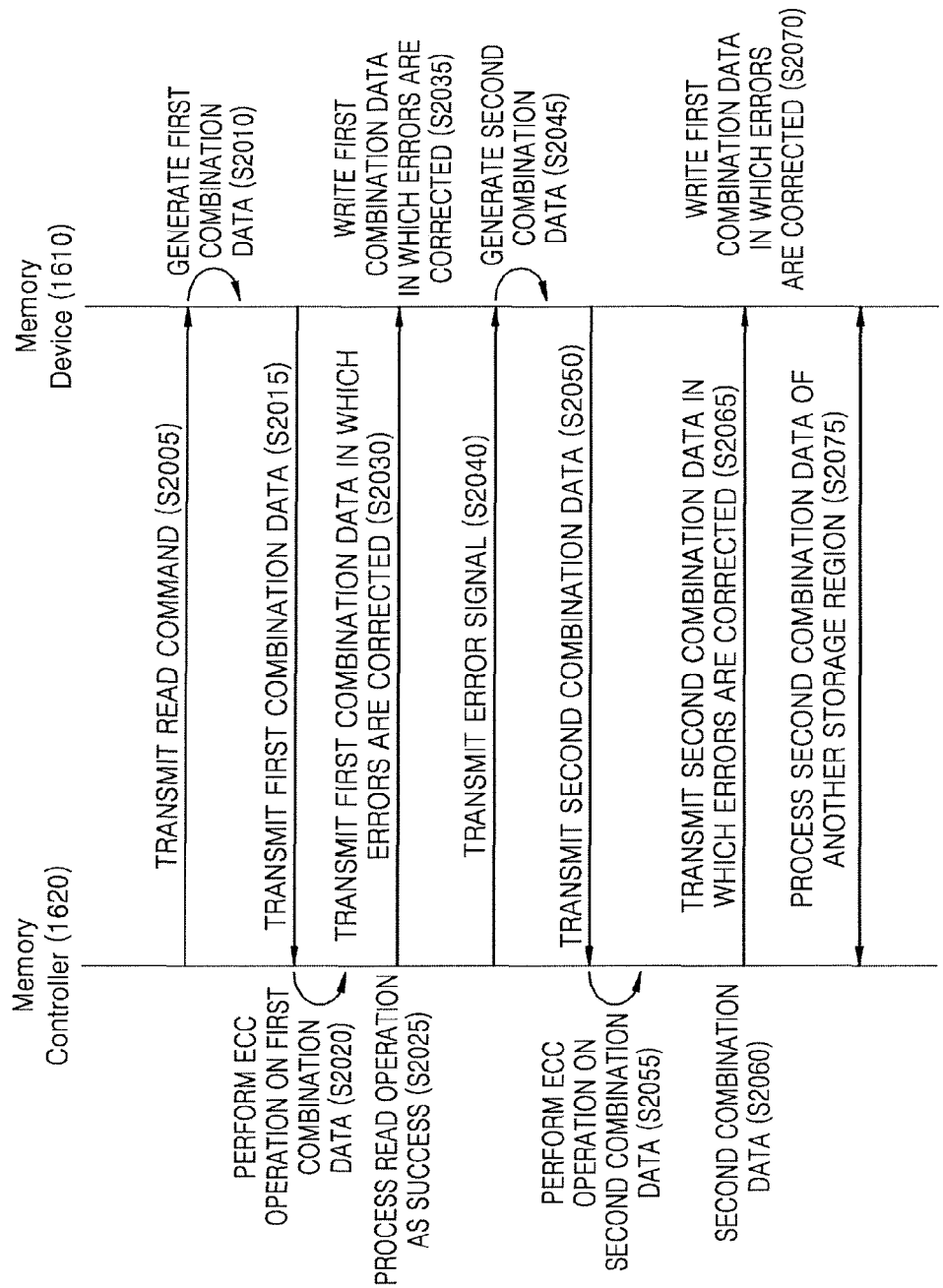

When fewer errors than required are corrected in the second combination data CDTA2 of the first storage region 1612_1, as shown in FIG. 21, second combination data CDTA2 associated with an additional storage region (i.e., a second storage region 1612_2) are generated, and the above-described operations are performed on the generated second combination data CDTA2 (S2075). In this case, the number of errors that are required to be corrected in the second combination data CDTA2 may be differently determined according to a method of processing errors in the first combination data CDTA1, as described below.

Figure 22:
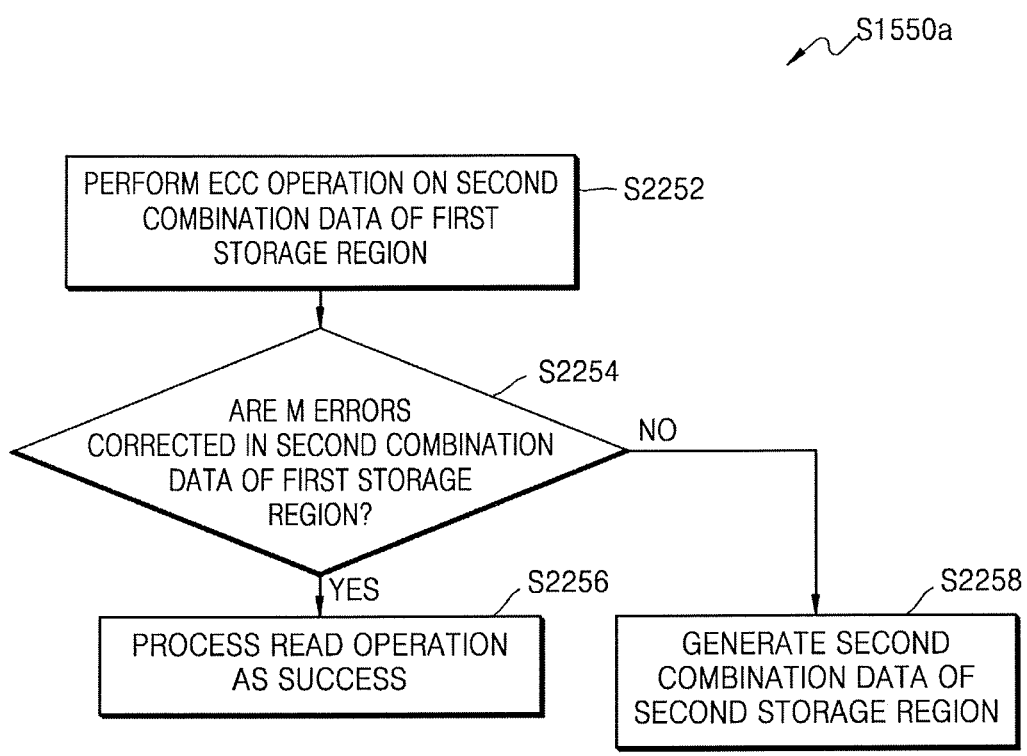
FIGS. 22 and 23 are flowcharts of a method of processing errors in first combination data, according to exemplary embodiments of the inventive concept.
Figure 23:
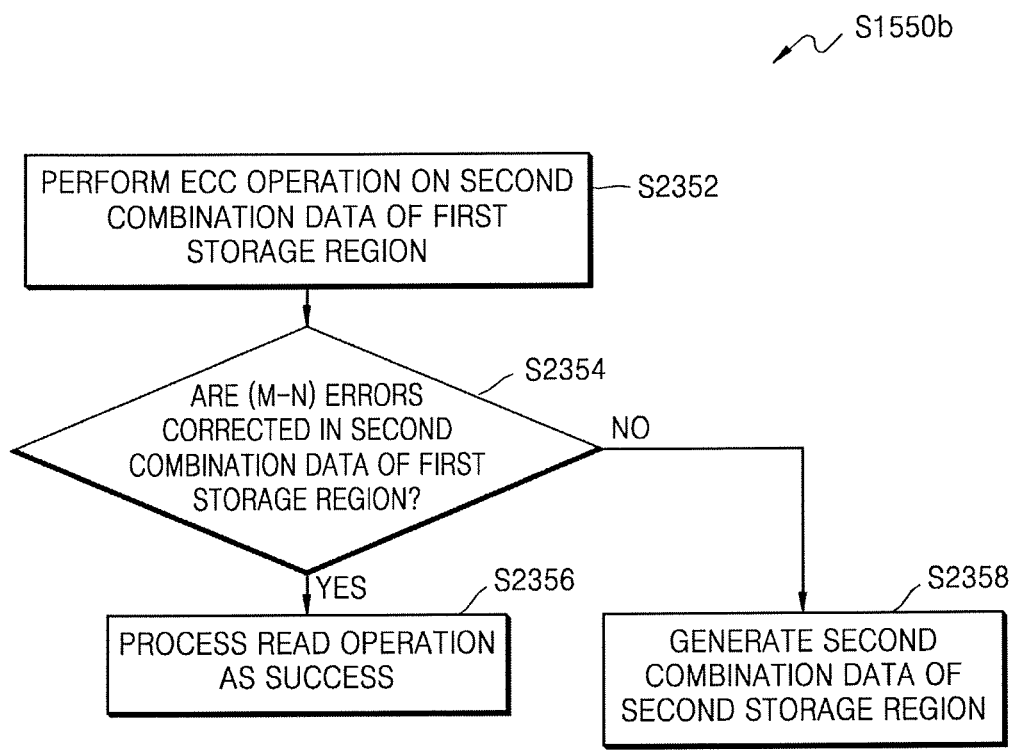

FIGS. 22 and 23 are flowcharts of methods of processing errors in first combination data according to exemplary embodiments of the inventive concept. Hereinafter, it is assumed that M errors are detected in the first combination data. First, referring to FIGS. 19 and 22, a method S1550*a* of processing errors in the first combination data CDTA1 includes performing an ECC operation on the second combination data CDTA2 associated with the first storage region 1612_1 (S2252) and determining whether M errors in the second combination data CDTA2 associated with the first storage region 1612_1 are corrected (S2254). If the M errors in the second combination data CDTA2 associated with the first storage region 1612_1 are corrected (refer to YES in S2254), a read operation is processed as a success (S2256). Due to the above-described operation, the first combination data CDTA1 extracted from the second combination data CDTA2 in which the M errors are corrected may not include any error.

In contrast, when the M errors in the second combination data CDTA2 are not corrected in the first storage region 1612_1 (refer to NO in S2254), second combination data CDTA2 associated with the second storage region 1612_2 is generated, and an ECC operation is performed (S2258). When a total of M errors are corrected in the second combination data CDTA2 associated with the first storage region 1612_1 and the second combination data CDTA2 associated with the second storage region 1612_2, a read operation may be processed as a success. When errors fewer than M errors are corrected in the second combination data CDTA2 associated with the first storage region 1612_1 and the second combination data CDTA2 associated with the second storage region 1612_2, a read operation may be processed as a success. When the memory device 1610 further includes another storage region configured to store user data, errors in the first combination data CDTA1 may be processed by sequentially processing second combination data associated with the remaining storage regions.

Next, referring to FIG. 23, a method S1550b of processing errors in first combination data CDTA1 also includes performing an ECC operation on second combination data CDTA2 associated with the first storage region 1612_1 (S2352). Based on a result of performing the ECC operation on the second combination data CDTA2, a read operation is processed as a success (S2356), or an additional operation is performed on the second combination data CDTA2 associated with the second storage region 1612_2 (S2358).

However, the method S1550b of processing the errors in the first combination data CDTA1 as illustrated in FIG. 23 may include determining whether not M errors but (M−N) errors are corrected in the second combination data CDTA2 (S2354). Even if all the M errors are not corrected in the second combination data CDTA2, first combination data CDTA1, which is extracted from the second combination data CDTA2 and written to the memory device 1610, may include only N errors that may be within an error correctability range of the first ECC engine ECCE1. Thus, when a new read command to read the first combination data CDTA1 is subsequently applied, errors in the first combination data CDTA1 may be corrected through a general route, that is, without generating the second combination data CDTA2.

Figure 24:
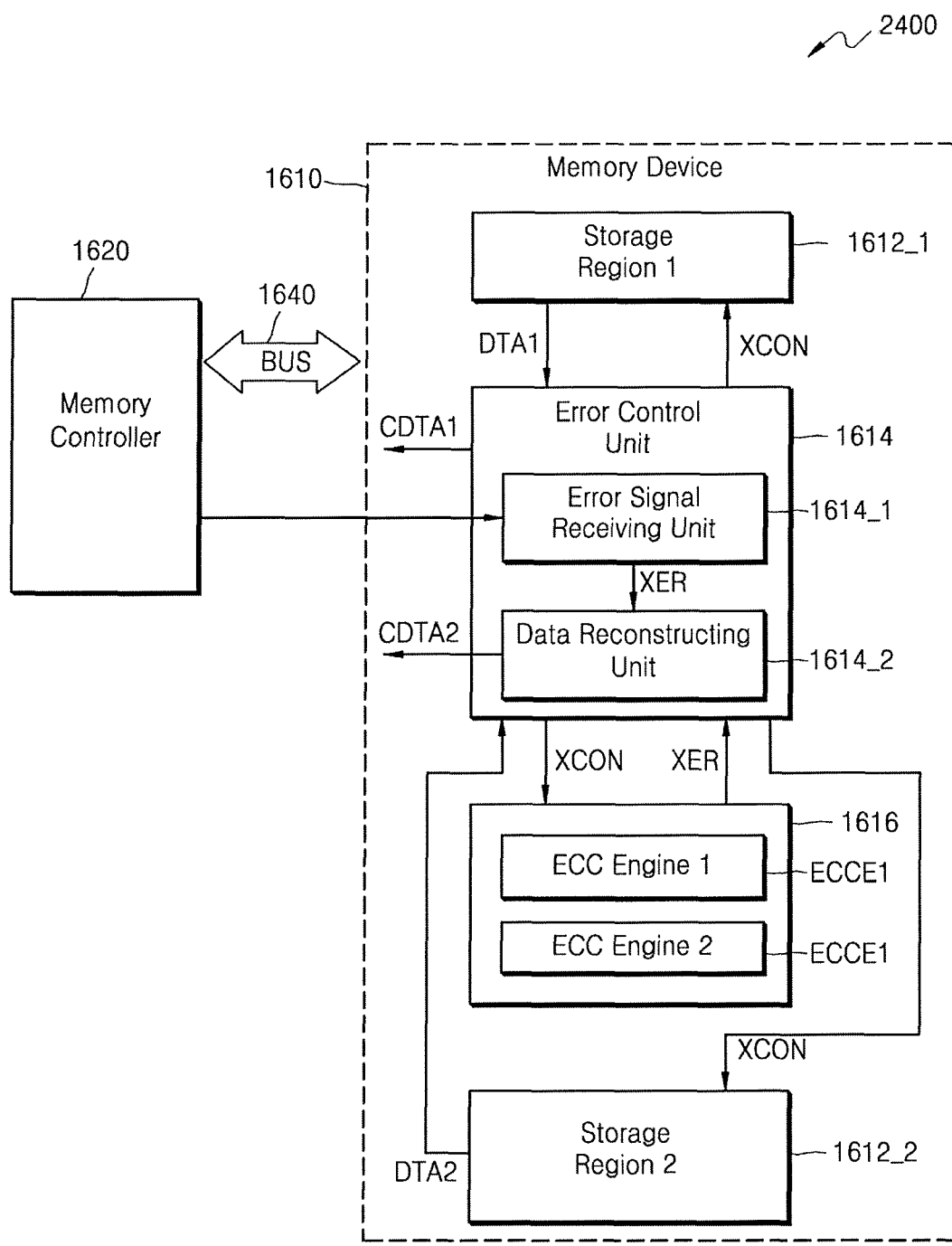
FIG. 24 is a diagram of a memory system according to an exemplary embodiment of the inventive concept.

FIG. 24 is a diagram of a memory system 2400 according to an exemplary embodiment of the inventive concept. Referring to FIG. 24, a memory device 1610 of the memory system 2400 includes an ECC unit 1616 including a first ECC engine ECCE1 and a second ECC engine ECCE2. In this case, when the memory device 1610 performs a read operation in response to a read command applied from the memory controller 1620, the memory device 1610 performs an ECC operation on first combination data CDTA1 or second combination data CDTA2 and transmits the first combination data CDTA1 in which errors are finally corrected, as a response to the read command, to the memory controller 1620. The memory controller 1620 may transmit the received first combination data CDTA1 to a host and process the reading operation as successful. If errors in the first combination data CDTA1 are not corrected by processing the second combination data CDTA2, the memory device 1610 may inform the memory controller 1620 of a failure of the read command.

Although a write operation of the memory system has not been described with reference to FIGS. 16, 19, and 20, since a write operation of a memory device or a memory system according to an exemplary embodiment is similar to the write operation described above with reference to FIGS. 10 to 13, detailed descriptions thereof are omitted here.

Figure 25:
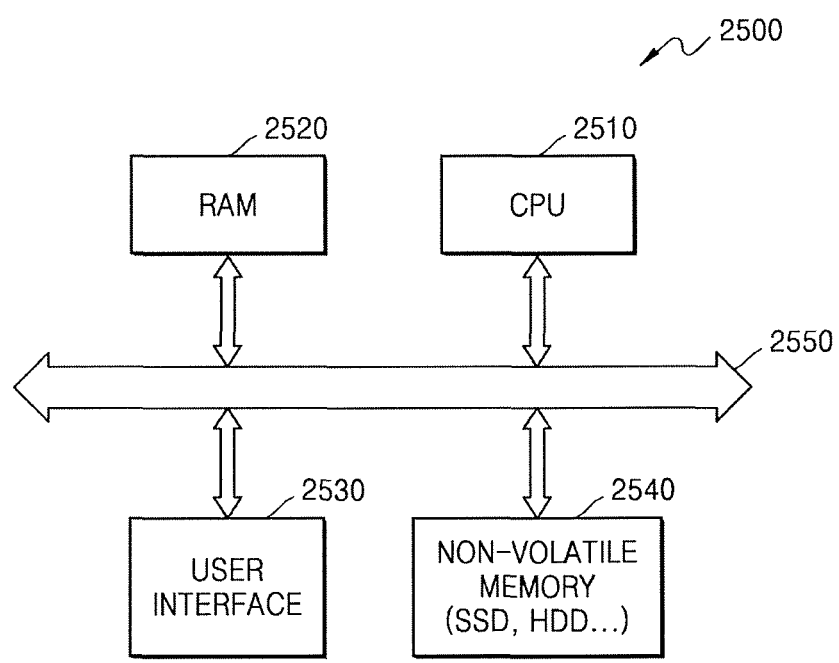
FIG. 25 is a block diagram of a memory device according to an exemplary embodiment of the inventive concept.

FIG. 25 is a block diagram of a computer system 2500 including a memory device according to an exemplary embodiment of the inventive concept. A RAM 2520 may be mounted in the computer system 2500, such as a mobile device or a desktop computer. The RAM 2520 may be any one of the memory devices according to the above-described exemplary embodiments. Also, the RAM 2520 of FIG. 25 may include both a memory device and a memory controller.

The computer system 2500 according to an exemplary embodiment includes a central processing unit (CPU) 2510, the RAM 2520, a user interface 2530, and a non-volatile memory 2540, each of which may be electrically connected to a bus 2550. The non-volatile memory 2540 may be a mass storage device, such as a solid-state disk (SSD) or a hard disk drive (HDD).

While the inventive concept has been particularly shown and described with reference to exemplary embodiments thereof, it will be understood that various changes in form and details may be made therein without departing from the spirit and scope of the inventive concept. For example, FIG. 21 illustrates a case in which the second combination data CDTA2 and the second combination data CDTA2 are sequentially transmitted to the memory controller 1620 and processed, but the inventive concept is not limited thereto. The second combination data CDTA2 and the second combination data CDTA2 may be simultaneously transmitted to the memory controller 1620 and processed.

What is claimed is:

1. A method of operating a memory device including a plurality of random access memory (RAM) chips, the method comprising:
   inputting a read command to the memory device;
   reading, by the memory device, a plurality of pieces of block data from first read block data corresponding to the read command from each of the plurality of RAM chips;
   generating, by the memory device, two-dimensional (2D) read data by combining the plurality of pieces of block data read from each of the RAM chips; and
   processing, by the memory device, the read command by using the 2D read data,
   wherein the memory device generates the 2D data by arranging the read pieces of block data as a plurality of rows of data, where each of the rows is a distinct one piece among the read pieces of block data.

2. The method of claim 1, wherein the reading of the plurality of pieces of block data comprises the RAM chips outputting data having a same row address as a row address of memory cells of the memory device in which the plurality of pieces of block data are stored.

3. The method of claim 1, further comprising the memory device performing a 2D error check and correction (ECC) decoding operation on the 2D read data to generate ECC-decoded 2D data, wherein the processing of the read command comprises the memory device outputting the first block data extracted from the ECC-decoded 2D data, as a response to the read command.

4. The method of claim 1, before performing the generating of the 2D read data, further comprising:
   generating, by the memory device, one-dimensional (1D) read data by combining the pieces of block data into a single row of data;
   obtaining, by the memory device, a first result by performing a single error correction-double error detection (SEC-DED) operation on the 1D read data; and
   determining, by the memory device, whether the generating of the 2D read data is to be performed based on the first result.

5. The method of claim 4, wherein the determining of whether the generating of the 2D read data is to be performed based on the first result comprises:
   controlling, by the memory device, the generating of the 2D read data to be performed when the first result indicates that the 1D data includes a double error; and
   controlling, by the memory device, the generating of the 2D data not to be performed when the first result indicates that the 1D data has no error or errors in the 1D data are corrected.

6. The method of claim 4, wherein when the first result indicates that the 1D read data has no error or errors in the 1D read data are corrected, the processing of the read command comprises the memory device generating a response to the read command as the 1D read data or the 1D read data in which the errors are corrected.

7. The method of claim 1, further comprising:
   inputting a write command and a first write block data to the memory device;
   updating, by the memory device, second write block data stored in each of the plurality of RAM chips to the first write block data in response to the write command; and
   updating, by the memory device, first parity data associated with 2D write data including the second write block data, to second parity data associated with 2D write data including the first write block data,
   wherein the 2D write data including the second write block data is first data arranged into first rows with the first write block data being one of the first rows, and
   wherein the 2D write data including the first write block data is second data arranged into second rows with the first write block data being one of the second rows.

8. The method of claim 7, wherein prior to the updating of the first parity data, the method further comprises generating the second parity data associated with the 2D write data including the first write block data by:
   reading, by the memory device, a plurality of pieces of write block data stored at a same row address as a row address of memory cells of the memory device in which the first write block data is to be stored;
   generating, by the memory device, the 2D write data including the first write block data by combining the plurality of pieces of write block data including the first write block data that are read; and
   performing, by the memory device, an ECC encoding operation on 2D write data including the first write block data.

9. The method of claim 7, wherein the updating of the first parity data associated with the 2D write data including the second write block data, to the second parity data associated with the 2D write data including the first write block data comprises:
   comparing, by the memory device, the first write block data with the second write block data; and
   generating, by the memory device, the second parity data associated with the 2D write data including the first write block data by applying a difference between the first write block data and the second write block data to the first parity data associated with the 2D write data including the second write block data.

10. A method of operating a memory device including a plurality of random access memory (RAM) chips, the method comprising:
    inputting a read command to the memory device, the read command referencing an address of a first RAM chip among the RAM chips;
    generating, by the memory device, one-dimensional (1D) data comprising a single row of data including a first data part of a word-line of each memory chip at the address;
    performing an error check and correct procedure on the 1D data to generate a result; and
    processing the read command using two-dimensional (2D) data when the result indicates a double error is present, where each column of the 2D data includes a different part of the word-line of the first RAM chip.

11. The method of claim 10, further comprising processing the read command by using the 1D data when the result indicates no errors are present in the 1D data or the errors have been corrected.

12. The method of claim 10, wherein the performing of the error check and correct procedure comprises performing a single error correction-double error detection (SEC-DED) operation on the 1D data to generate the result.

13. The method of claim 10, wherein during the processing of the read command using the 2D data, the method comprises using an error check and correct procedure on the 2D data that is configured to detect errors in units of columns of the 2D data.

14. The method of claim 10, wherein the memory device is embodied by a dynamic random access memory (DRAM) module.

15. The method of claim 10, wherein the memory device comprises a three-dimensional memory array.

* * * * *